(12) United States Patent
Miyazaki et al.

(10) Patent No.: US 8,325,284 B2
(45) Date of Patent: Dec. 4, 2012

(54) LIQUID CRYSTAL DISPLAY DEVICE AND MANUFACTURING METHOD THEREOF

(75) Inventors: Takahiro Miyazaki, Mobara (JP); Jun Ooida, Mobara (JP)

(73) Assignees: Hitachi Displays, Ltd., Chiba (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 298 days.

(21) Appl. No.: 12/871,370

(22) Filed: Aug. 30, 2010

(65) Prior Publication Data
US 2011/0050552 A1    Mar. 3, 2011

(30) Foreign Application Priority Data

Sep. 1, 2009    (JP) ................. 2009-201240

(51) Int. Cl.
*G02F 1/136*     (2006.01)
(52) U.S. Cl. ........................... 349/43; 349/46

(58) Field of Classification Search ............ 349/43, 349/46
See application file for complete search history.

(56) References Cited

FOREIGN PATENT DOCUMENTS
JP    2004-093821    3/2004

*Primary Examiner* — Phu Vu
(74) *Attorney, Agent, or Firm* — Antonelli, Terry, Stout & Kraus, LLP.

(57) ABSTRACT

The manufacturing method of a liquid crystal display device includes a step of forming the scanning signal lines including a step in which a photosensitive material film is exposed using an exposure device having a spatial light modulating element which generates an exposure pattern by a numerical control based on drawing data prepared based on the layout data. The drawing data is prepared by correction such that a shape of a portion of the scanning signal line in the layout data which is overlapped to a source electrode has an area corresponding to the distribution of a film thickness of an insulation layer interposed between the scanning signal line and the source electrode.

4 Claims, 16 Drawing Sheets

LIQUID CRYSTAL DISPLAY DEVICE AND MANUFACTURING METHOD THEREOF

CLAIM OF PRIORITY

The present application claims priority from Japanese application serial No. 2009-201240 filed on Sep. 1, 2009, the content of which is hereby incorporated by reference into this application.

BACKGROUND OF THE INVENTION

The present invention relates to a liquid crystal display device and a manufacturing method thereof, and more particularly to a technique which is effectively applicable to a method for manufacturing a liquid crystal display panel by multiple-piece simultaneous manufacturing.

An active-matrix-type TFT liquid crystal display device (hereinafter simply referred to as liquid crystal display device) has been popularly used as a liquid crystal display for a liquid crystal television receiver set or a personal computer, or a liquid crystal display of a portable electronic device such as a mobile phone terminal.

The liquid crystal display device includes a liquid crystal display panel where a liquid crystal material is sealed between a pair of substrates, and a display region of a liquid crystal display panel is constituted of a mass of pixels each of which has a TFT element, a pixel electrode, a common electrode and a liquid crystal layer (liquid crystal material). Further, in case of the active-matrix-type liquid crystal display device, the liquid crystal display panel includes a plurality of scanning signal lines and a plurality of video signal lines.

Here, the TFT element of each pixel has a source thereof connected to the pixel electrode and a drain thereof connected to one of the plurality of video signal lines. Further, the TFT element of each pixel has a gate electrode thereof connected to one of the plurality of scanning signal lines.

In the liquid crystal display device, a video or an image is displayed by controlling a transmission quantity of light in each pixel, a reflection quantity of light or both the transmission quantity and the reflection quantity of light based on a potential difference between the pixel electrode and the common electrode. Here, in the liquid crystal display device, an operation in which a plurality of TFT elements each of which has a gate electrode thereof connected to one scanning signal line out of a plurality of scanning signal lines are turned on, and a video signal (grayscale voltage) which is applied to the respective video signal lines is written in the pixel electrodes via the TFT elements is repeatedly performed.

Here, also in the liquid crystal display device, the video or an image is displayed by inverting polarity of each pixel for every preset frame period, that is, by inverting the level relationship between a potential of the pixel electrode and a potential of the common electrode.

In the conventional liquid crystal display device, for example, image retention attributed to distortions (rounding) of a waveform of a scanning signal applied to the scanning signal line is liable to occur. It is known that the image retention attributed to distortions of the waveform of the scanning signal is liable to occur at a portion of the scanning signal line remote from a signal input end in general. As a method for reducing such image retention attributed to the distortions of the waveform of the scanning signal, for example, there has been proposed a method which increases parasitic capacitance $C_{gs}$ formed between a gate electrode and a source electrode of a TFT element corresponding to the increase of a distance from a signal input end of a scanning signal line (see JP-A-2004-093821 (patent document 1), for example).

SUMMARY OF THE INVENTION

In the manufacture of a liquid crystal display panel, usually, it is often the case where a method referred to as multiple-piece simultaneous manufacturing in which a plurality of liquid crystal display panels are collectively manufactured using a pair of mother glasses is adopted.

In case of so-called four-piece simultaneous manufacturing in which four liquid crystal display panels are manufactured using a pair of mother glasses, in each of four regions set on one mother glass, a circuit (a thin film stacked body) which includes a plurality of scanning signal lines, a plurality of video signal lines, a plurality of TFT elements, a plurality of pixel electrodes and the like is formed.

The circuit is formed by performing a step in which a conductive film or a semiconductor film is formed by etching and a step in which an insulation film is formed in predetermined order.

Here, the insulation film is usually formed over the whole circuit forming surface of the mother glass using a film forming method such as a CVD method. Accordingly, a film thickness of the insulation film formed on the mother glass has the distribution where the insulation film at a center portion of the mother glass exhibits the largest film thickness and the film thickness is gradually and concentrically decreased as a distance from the center is increased.

In case of the four-piece simultaneous manufacturing, the circuits which are formed in the above-mentioned four regions of the mother glass usually have translational symmetry. Accordingly, four liquid crystal display panels obtained from one pair of mother glasses differ from each other in the distribution of film thickness of the insulation film.

Here, to consider the scanning signal line as a circuit, the scanning signal line includes a plurality of line resistances and a plurality of line capacitances. As the line capacitances of the scanning signal line, for example, a parasitic capacitance $C_{gs}$ formed between the scanning signal line and a source electrode or a pixel electrode of a TFT element, a parasitic capacitance formed between the scanning signal line and the video signal lines and the like are named. These parasitic capacitances are changed corresponding to a thickness of an insulation layer interposed between the scanning signal line and other conductive layer, for example. Accordingly, when a film thickness of the insulation layer relevant to the parasitic capacitance has the distribution (gradient) in one sheet of the liquid crystal display panel, the magnitudes of the line capacitances of the respective scanning signal lines differ corresponding to the distribution of the film thickness of the insulation layer. When the magnitudes of the line capacitances of the respective scanning signal lines differ from each other in this manner, time constants of the respective scanning signal lines differ from each other. As a result, the manner of distortions of the waveform of the scanning signal (signal delay) differs among the respective scanning signal lines formed in one sheet of the liquid crystal display panel.

Accordingly, to prevent image retention attributed to the distortions of a waveform of a scanning signal by adjusting the magnitude of the parasitic capacitance $C_{gs}$ of each pixel, it is desirable to correct an overlapping area between the gate electrode (scanning signal line) and the source electrode, an in-plane distance between the gate electrode (scanning signal line) and the pixel electrode and the like in each TFT element, for example, by taking the distribution of the film thickness of the insulation film into consideration.

Further, as described previously, the plurality of liquid crystal display panels obtained from one pair of mother glasses differ from each other in the distribution of the film thickness of the insulation film. Accordingly, the plurality of liquid crystal display panels obtained from one pair of mother glasses differ from each other in the manner of distortions of the waveform of the scanning signal in each scanning signal line.

Accordingly, in the manufacture of the liquid crystal display panels by multiple-piece simultaneous manufacturing, to reduce the image retention in the individual liquid crystal display panels obtained from the pair of mother glasses and also to make a level (degree of intensity) of the image retention uniform among the plurality of liquid crystal display panels, it is desirable to perform the different corrections for respective mounting positions (regions where a circuit is formed).

Further, in forming the insulation film using a film forming method such as a CVD method, it is often the case that the relationship between a distance from the center of mother glasses and a film thickness reduction ratio differs depending on a CVD device used in film forming, for example. Accordingly, to make a level of the image retention uniform among a plurality of liquid crystal display panels manufactured on different manufacturing lines based on one pair of layout data, it is desirable to perform the different correction for respective manufacturing lines, for example, by taking the distribution of a film thickness in the CVD method used in film forming into consideration.

However, the scanning signal lines and the source electrodes which are relevant to the magnitude of the parasitic capacitance $C_{gs}$ are usually formed by etching a conductive film. In forming the conductive film by etching, a photosensitive material film formed on the conductive film is exposed and developed thus forming a resist (etching resist) having a predetermined pattern. Here, in the conventional manufacturing method of a liquid crystal display panel, the photosensitive material film formed on the conductive film is usually exposed using an exposure device having a photo mask.

In exposing the photosensitive material film formed on the conductive film using the exposure device having the photo mask, to correct an overlapping area between the gate electrode (scanning signal line) and the source electrode, in-plane distance between the gate electrode (scanning signal line) and the pixel electrode or the like corresponding to the distribution of the film thickness of the insulation film, for example, it is necessary to prepare photo masks having different exposure patterns for respective mounting positions or respective manufacturing lines. Accordingly, in the conventional manufacturing method of a liquid crystal display panel using multiple-piece simultaneous manufacturing, there has been a drawback that it is difficult to reduce the image retention in the individual liquid crystal display panels and to make the degree of the image retention uniform among the plurality of liquid crystal display panels thus deteriorating manufacturing efficiency.

Accordingly, it is an object of the present invention to provide a manufacturing method of a liquid crystal display panel which can reduce image retention in individual liquid crystal display panels and, at the same time, can easily make levels of the image retention uniform among the plurality of liquid crystal display panels.

It is another object of the present invention to provide a liquid crystal display panel which can reduce image retention attributed to the distortions of a waveform of a scanning signal irrelevant to the distribution of a film thickness of an insulation film.

The above-mentioned and other objects and novel features of the present invention will become apparent from the description of this specification and attached drawings.

To explain the summary of typical inventions among inventions disclosed in this specification, they are as follows.

(1) According to one aspect of the present invention, there is provided a liquid crystal display device comprising a liquid crystal display panel in which a liquid crystal material is sealed between a TFT substrate and a counter substrate, the liquid crystal display panel being configured such that the TFT substrate includes a plurality of scanning signal lines, a plurality of video signal lines, a plurality of TFT elements and a plurality of pixel electrodes, the plurality of TFT elements respectively have a gate electrode thereof connected to one scanning signal line out of the plurality of scanning signal lines, and have a drain electrode thereof connected to one video signal line out of the plurality of video signal lines, and the combination of the scanning signal line to which the gate electrode is connected and the video signal line to which the drain electrode is connected differs for every TFT element, wherein a source electrode of the TFT element includes a portion which is overlapped to the scanning signal line and a portion which is not overlapped to the scanning signal line, the plurality of TFT elements which are connected to said one scanning signal line set the relationship between a distance from a signal input end of the scanning signal line and an area of an overlapping region between the source electrode and the scanning signal line to the monotonous decrease relationship.

(2) In a liquid crystal display device having the constitution (1), the plurality of TFT elements which are connected to one video signal line set the relationship between the distance from a signal input end of the video signal line and the area of the overlapping region between the source electrode and the scanning signal line to the monotonous decrease relationship.

(3) According to another aspect of the present invention, there is provided a manufacturing method of a liquid crystal display device comprising the steps of: forming a TFT substrate in which a plurality of scanning signal lines, a plurality of video signal lines, a plurality of TFT elements and a plurality of pixel electrodes are formed based on preset layout data; forming a counter substrate; adhering the TFT substrate and the counter substrate to each other; and filling a liquid crystal material in a space defined between the TFT substrate and the counter substrate, wherein a source electrode of each one of the plurality of TFT elements is connected to the pixel electrode, and includes a portion which is overlapped to the scanning signal line and a portion which is not overlapped to the scanning signal line, the step of forming the TFT substrate comprises: a first step in which the plurality of scanning signal lines are formed; a second step in which a first insulation layer is formed after the first step; and a third step in which semiconductor layers of the TFT elements, the plurality of video signal lines and the source electrodes of the TFT elements are formed on the first insulation layer, the first step comprises the steps of: forming a conductive film; forming a photosensitive material film on the conductive film; exposing and developing the photosensitive material film; and removing undesired portions of the conductive film using the developed photosensitive material film as a mask, the exposure of the photosensitive material film is performed using an exposure device having a spatial light modulating element which generates an exposure pattern by a numerical control based on drawing data prepared based on the layout data, and the drawing data is prepared by correction such that a shape of a portion of the scanning signal line in the layout data which is overlapped to the source electrode has an area corresponding to the distribution of a film thickness of the first insulation layer formed in the second step.

(4) In the manufacturing method of a liquid crystal display device having the constitution (3), a plurality of TFT substrates are collectively formed using one mother substrate in the step of forming the TFT substrate, and the exposure of the photosensitive material film performed in the first step is performed using the drawing data which differs for every position of the TFT substrate on the mother substrate.

According to the manufacturing method of a liquid crystal display device of the present invention, it is possible to reduce image retention in individual liquid crystal display panels and, at the same time, it is possible to easily make levels of image retention uniform among the plurality of liquid crystal display panels.

Further, according to the liquid crystal display device of the present invention, it is possible to reduce image retention attributed to the distortions of a waveform of a scanning signal irrelevant to the distribution of a film thickness of an insulation film of the liquid crystal display panel.

DETAILED DESCRIPTION OF THE INVENTION

Hereinafter, the present invention is explained in detail in conjunction with modes (embodiments) by reference to drawings.

Here, in all drawings for explaining the embodiments, parts having identical functions are given same symbols and their repeated explanation is omitted.

Figure 1:
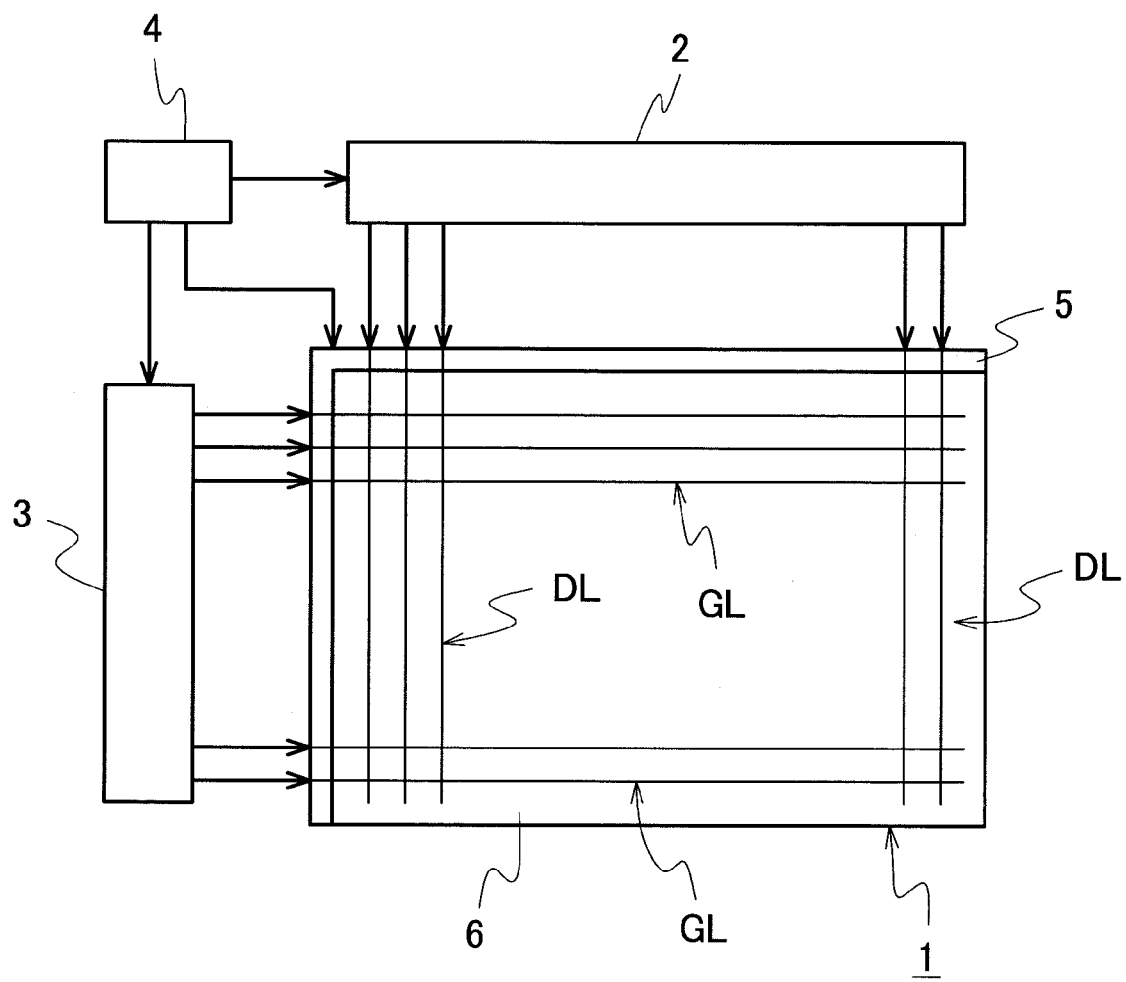
FIG. 1 is a schematic block diagram showing one example of the schematic constitution of a liquid crystal display device.
Figure 2:
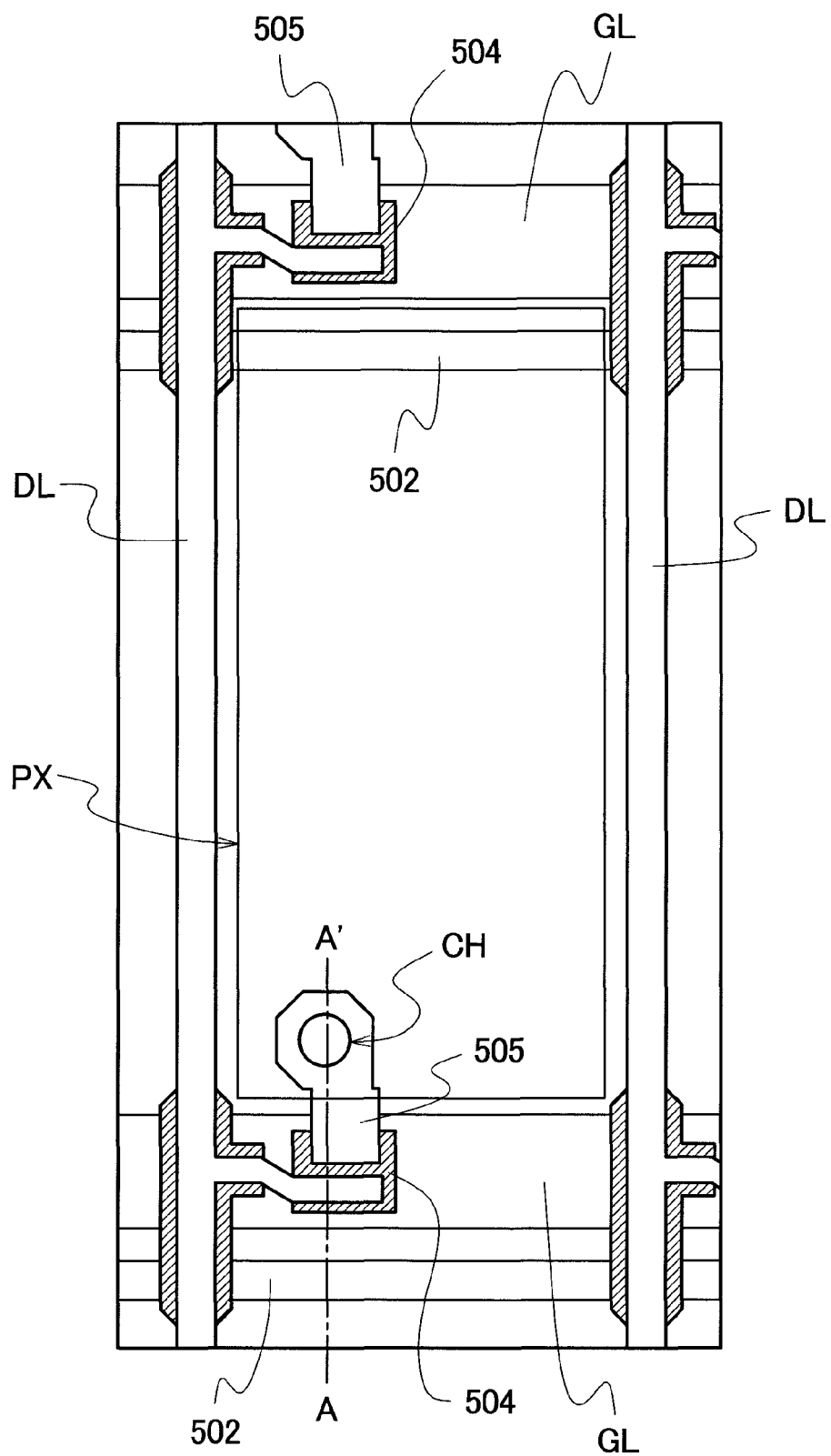
FIG. 2 is a schematic plan view showing one example of the planar constitution of a pixel on a TFT substrate.
Figure 3:
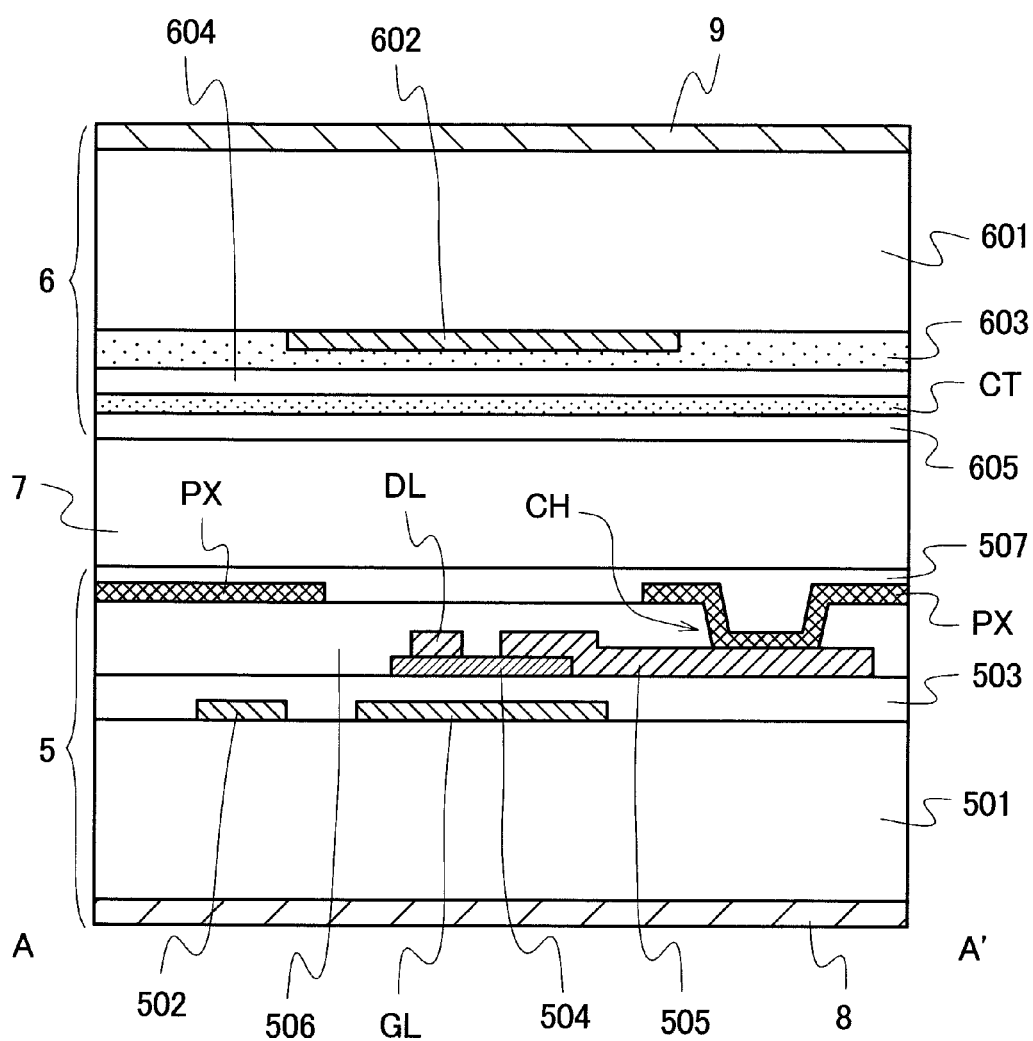
FIG. 3 is a schematic cross-sectional view showing one example of the cross-sectional constitution of a liquid crystal display panel taken along a line A-A' in FIG. 2.

FIG. 1 to FIG. 3 are schematic views for explaining one example of the schematic constitution of a liquid crystal display device according to the present invention.

FIG. 1 is a schematic block diagram showing one example of the overall constitution of the liquid crystal display device. FIG. 2 is a schematic plan view showing one example of the planar constitution of a pixel on a TFT substrate. FIG. 3 is a schematic cross-sectional view showing one example of the cross-sectional constitution of a liquid crystal display panel taken along a line A-A' in FIG. 2.

The liquid crystal display device according to the present invention includes, for example, as shown in FIG. 1, a liquid crystal display panel 1, a first drive circuit 2, a second drive circuit 3 and a control circuit 4. Further, the liquid crystal display device according to the present invention includes, besides the above-mentioned constitutional elements, a backlight unit and the like, for example.

The liquid crystal display panel 1 is a display panel in which a liquid crystal material is sealed in a space defined between a TFT substrate 5 and a counter substrate 6. Further, the liquid crystal display panel 1 is an active-matrix-type liquid crystal display panel, wherein the TFT substrate 5 includes a plurality of scanning signal lines GL and a plurality of video signal lines DL. Further, a display region of the liquid crystal display panel 1 is constituted of a mass of pixels each of which has a TFT element, a pixel electrode, a common electrode and a liquid crystal layer (liquid crystal material).

The TFT substrate 5 includes, for example, as shown in FIG. 2 and FIG. 3, a first insulation substrate 501 formed of a glass substrate or the like, a first thin film stacked body which is formed on a surface of the first insulation substrate 501 which faces a liquid crystal layer 7 in an opposed manner, and a first polarizer 8.

The first thin film stacked body includes the scanning signal lines GL, holding capacitance lines 502, a first insulation layer 503, semiconductor layers 504 of the TFT elements, the video signal lines DL, source electrodes 505 of the TFT elements, a second insulation layer 506, pixel electrodes PX, a first alignment film 507 and the like.

On the other hand, the counter substrate 6 includes, for example, as shown in FIG. 3, a second insulation substrate 601 formed of a glass substrate or the like, a second thin film stacked body which is formed on a surface of the second insulation substrate 601 which faces the liquid crystal layer 7 in an opposed manner, and a second polarizer 9.

The second thin film stacked body includes a black matrix 602, color filters 603, a leveling layer 604, common electrodes CT, a second alignment film 605 and the like.

The first drive circuit 2 is a circuit which generates a grayscale voltage applied to the pixel electrodes PX of the respective pixels and outputs the grayscale voltage to the respective video signal lines DL. The first drive circuit 2 is called "data driver" or the like in general. The second drive circuit 3 is a circuit which generates a scanning signal for selecting the pixels (pixel electrodes PX) in which the grayscale voltage applied to the respective video signal lines DL from the first drive circuit 2 is written, and outputs the scanning signal to the respective scanning signal lines GL. The second drive circuit 3 is called "gate driver", "scanning driver" or the like in general. The control circuit 4 is a circuit which controls an operation of the first drive circuit 2, an operation of the second drive circuit 3, a voltage applied to the common electrodes CT and the like. The control circuit 4 is called "TFT controller", "T-CON" or the like in general.

The manner of operation of the liquid crystal display device according to the present invention is basically equal to the manner of operation of a conventional liquid crystal display device. Accordingly, the explanation with respect to the specific constitution of the first drive circuit 2, the second drive circuit 3 and the control circuit 4 and the manner of operation of the liquid crystal display device are omitted here.

Figure 4:
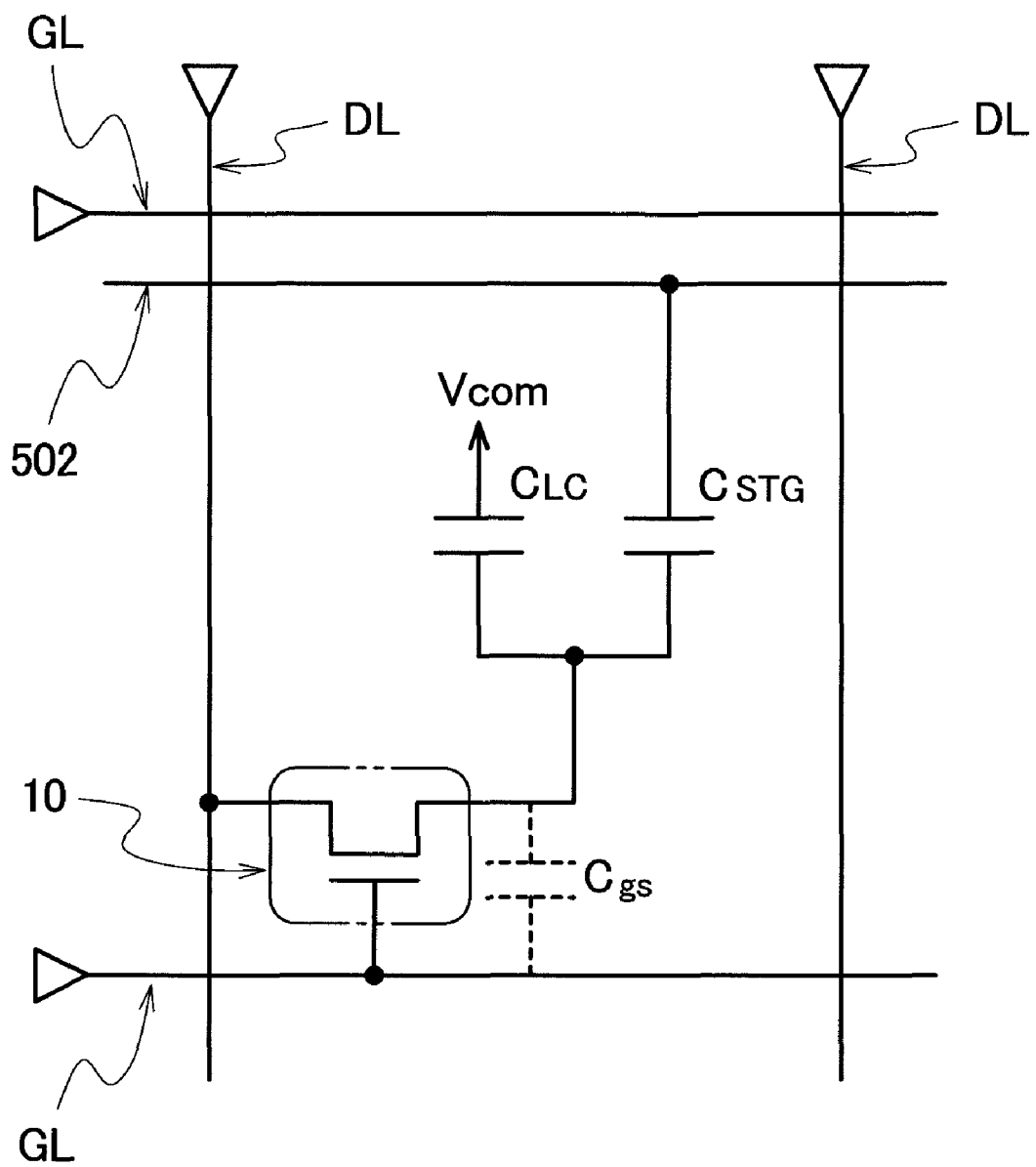
FIG. 4 is a schematic equivalent circuit diagram of the pixel shown in FIG. 2 and FIG. 3.
Figure 5:
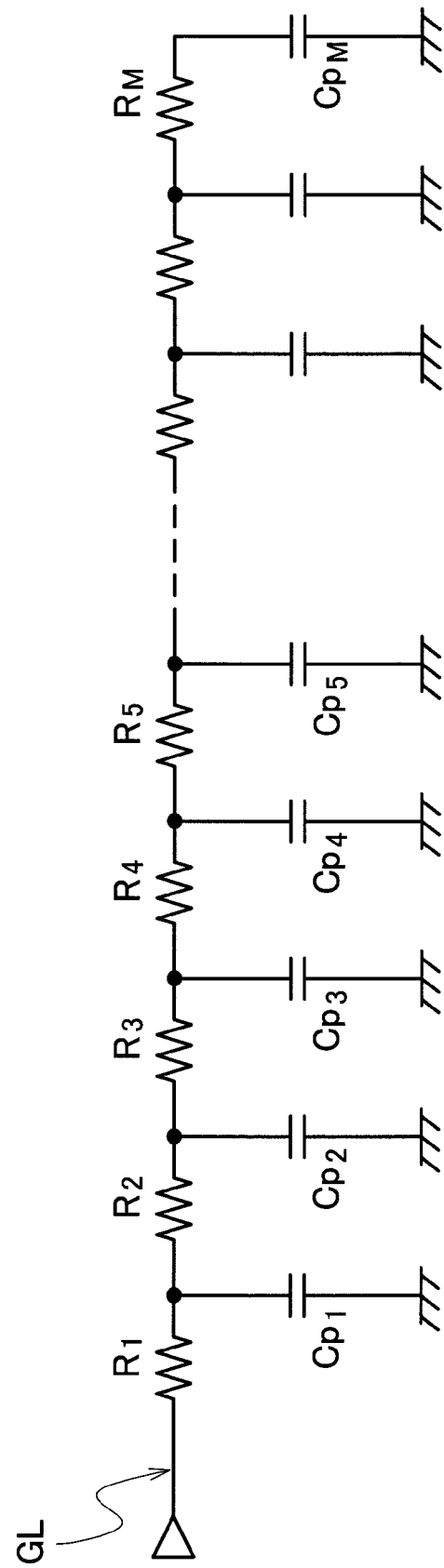
FIG. 5 is a schematic equivalent circuit diagram of a scanning signal line.
Figure 6:
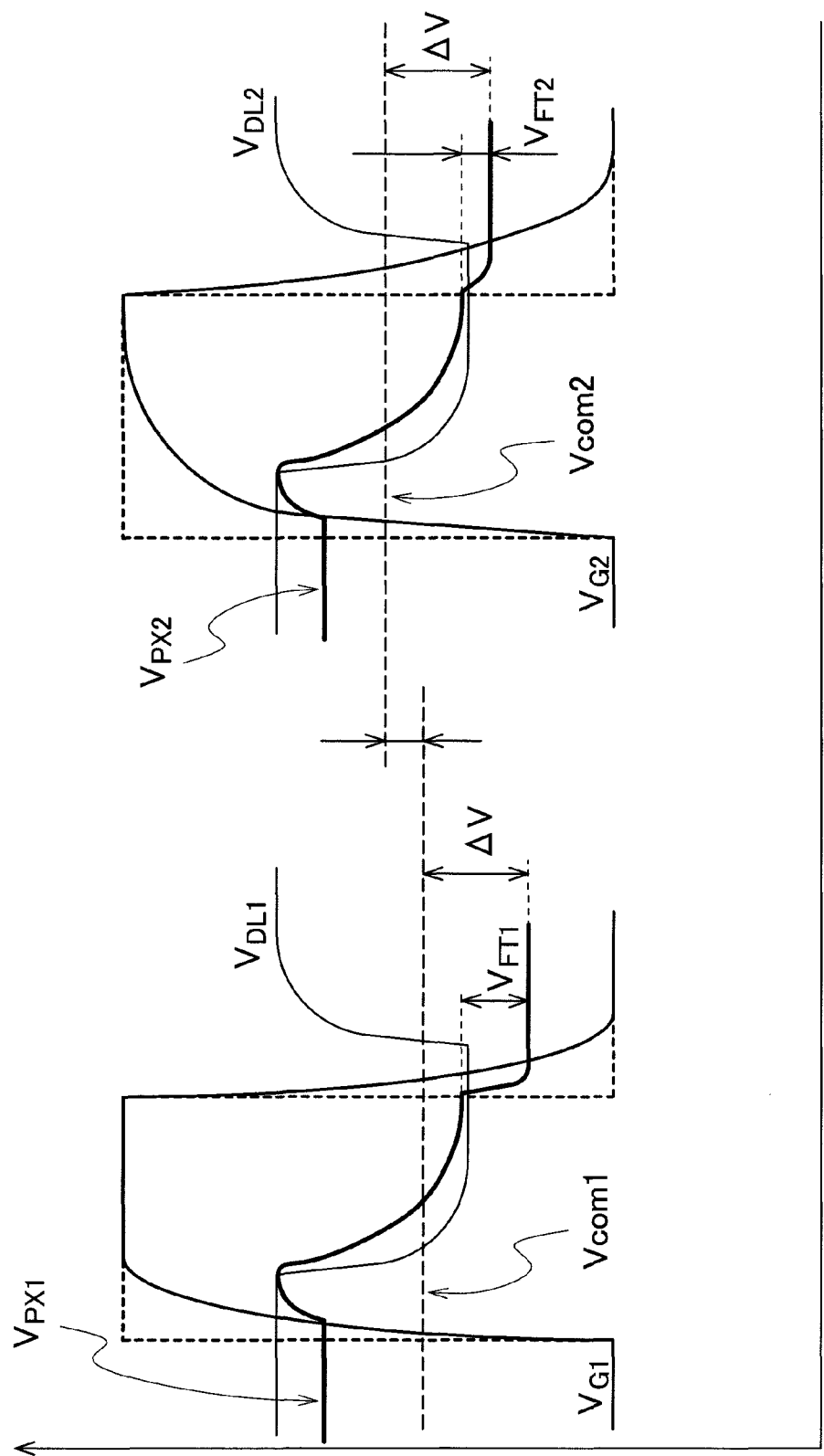
FIG. 6 is a schematic view showing one example of a mode in which a potential of a pixel electrode changes in two pixels which differ from each other in the distance from a signal input end of the scanning signal line.

FIG. 4 to FIG. 6 are schematic views for explaining one example of a cause of the occurrence of image retention in a conventional liquid crystal display device.

FIG. 4 is a schematic equivalent circuit diagram of the pixel shown in FIG. 2 and FIG. 3. FIG. 5 is a schematic equivalent circuit diagram of the scanning signal line. FIG. 6 is a schematic view showing one example of a mode in which a potential of a pixel electrode changes in two pixels which differ from each other in the distance from a signal input end of the scanning signal line.

The equivalent circuit of the pixel shown in FIG. 2 and FIG. 3 can be expressed as shown in FIG. 4, for example, and includes a TFT element 10, a pixel capacitance $C_{LC}$ and a holding capacitance $C_{STG}$.

The TFT element 10 has a gate electrode thereof connected to the scanning signal line GL and a drain electrode thereof connected to the video signal line DL. Further, a source electrode 505 of the TFT element 10 is connected to the pixel electrode PX. Here, although the source and the drain of the TFT element 10 are determined based on the level relationship between a potential of the video signal line DL and a potential of the pixel electrode PX, in this specification, the electrode which is connected to the video signal line DL is referred to as the drain and the electrode which is connected to the pixel electrode PX is referred to as the source.

The pixel capacitance $C_{LC}$ is a capacitance which is formed by the pixel electrode PX, the common electrode CT and the liquid crystal layer 7, and is also referred to as a liquid crystal capacitance or the like. The pixel capacitance $C_{LC}$ changes an alignment state of the liquid crystal layer 7 corresponding to a potential difference between the pixel electrode PX and the common electrode CT. Due to such an operation, a transmission quantity of light radiated from a backlight unit is controlled.

The holding capacitance $C_{STG}$ is a capacitance which is formed by the pixel electrode PX, a holding capacitance line 502 and insulation layers (a first insulation layer 503 and a second insulation layer 506) which are interposed between the pixel electrode PX and the holding capacitance line 502, and is also referred to as "auxiliary capacitance", "storage capacitance" or the like. The holding capacitance $C_{STG}$ is a capacitance for holding the potential of the pixel electrode PX during a period in which the TFT element 10 is in an OFF state. Various methods are available as a method for forming the holding capacitance $C_{STG}$.

The pixel having the constitution shown in FIG. 2 and FIG. 3 also has a parasitic capacitance $C_{gs}$, for example, bedsides the pixel capacitance $C_{LC}$ and the holding capacitance $C_{STG}$. The parasitic capacitance $C_{gs}$ is a capacitance which is formed between the gate electrode (scanning signal line GL) and the source electrode 505 of the TFT element 10. Further, besides the parasitic capacitance $C_{gs}$, the pixel having the constitution shown in FIG. 2 and FIG. 3 also has a parasitic capacitance which is formed between the gate electrode (scanning signal line GL) and the drain electrode (video signal line DL) of the TFT element 10 or the like, for example.

The parasitic capacitances are, different from the pixel capacitance $C_{LC}$ and the holding capacitance $C_{STG}$, undesired capacitances in the operation of the pixel (control of transmission quantity of light). However, the formation of these parasitic capacitances is unavoidable in view of the constitution of the TFT substrate 5.

In this manner, in the active-matrix-type liquid crystal display device, the parasitic capacitance $C_{gs}$ which uses the scanning signal line GL as one electrode or the like is formed. Further, the scanning signal line GL is formed using metal such as aluminum, for example, so that the scanning signal line GL has electric resistance.

Accordingly, to consider one scanning signal line GL as a circuit, for example, as shown in FIG. 5, the scanning signal line GL includes a plurality of line resistances $R_m$ (m=1, 2, 3, . . . , M) and a plurality of line capacitances (parasitic capacitances) $Cp_m$. Accordingly, in a waveform of a scanning signal applied to the scanning signal line GL from the second drive circuit 3, the distortions attributed to the line resistance $R_m$ and the line capacitance $Cp_m$ are generated. Further, the larger the distance from a signal input end of the scanning signal line GL, the larger the distortions of the waveform of the scanning signal become. In FIG. 5, one line resistance $R_m$ is the line resistance amounting to one pixel and one line capacitance $Cp_m$ is the composite capacitance of parasitic capacitances amounting to one pixel.

In the liquid crystal display device having the backlight unit, light (planar beam) radiated from the backlight unit is modulated by controlling a transmission quantity of light in each pixel thus displaying a video or an image. Here, the transmission quantity of light is controlled based on the potential difference between the pixel electrode PX and the common electrode CT. Here, in a generally-used liquid crystal display device, the occurrence of flickers or image retention is suppressed by inverting the polarity of a grayscale voltage applied to the pixel electrode PX, that is, by inverting the level relationship between a potential of the pixel electrode PX and a potential of the common electrode CT for every predetermined frame period (for example, every 1 frame period).

However, in the conventional liquid crystal display device, for example, the image retention attributed to the distortions of the waveform of the scanning signal, the parasitic capacitance $C_{gs}$ and the like occurs.

In the conventional liquid crystal display device which includes the pixels each of which has the constitution shown in FIG. 2 and FIG. 3, in writing grayscale voltages having the same potential $V_k$ to the pixel electrodes PX of two pixels which differ from each other in distance from the signal input end of the scanning signal line GL, the potential of the gate electrode and the potential of the pixel electrode PX change with time respectively as shown in FIG. 6, for example.

In FIG. 6, symbols $V_{G1}$, $V_{DL1}$ and $V_{PX1}$ on a left side respectively indicate waveforms showing the changes with time of the potential of the gate electrode, the potential of the drain electrode (video signal line DL) and the potential of the pixel electrode PX of a first pixel U1 at a position near the signal input end. Further, in FIG. 6, symbols $V_{G2}$, $V_{DL2}$ and $V_{PX2}$ on a right side respectively indicate waveforms showing the changes with time of the potential of the gate electrode, the potential of the drain electrode (video signal line) and the potential of the pixel electrode PX of a second pixel U2 at a position remote from the signal input end. Further, in FIG. 6, symbols Vcom1 and Vcom2 indicate optimum common voltages of the first pixel U1 and the second pixel U2 respectively. Here, the optimum common voltage is a common voltage for bringing the potential difference between the pixel electrode PX and the common electrode CT to a predetermined value $\Delta V$ set on a design stage.

In the active-matrix-type liquid crystal display device, in controlling a light transmission quantity of the pixel, a grayscale voltage is applied to the drain electrode so as to write the grayscale voltage in the pixel electrode PX in synchronism with a period during which the TFT element 10 assumes an ON state.

A waveform of the scanning signal applied to the scanning signal line GL from the second drive circuit 3 has, for example, a rectangular shape as indicated by a dotted line in FIG. 6. However, distortions (delay) corresponding to the distance from the signal input end are generated in the scanning signal applied to the scanning signal line GL as described previously. Here, the potential of the gate electrode of the first pixel U1 and the potential of the gate electrode of the second pixel U2 change with time respectively as indicated by the waveform $V_{G1}$ and the waveform $V_{G2}$. That is, the waveform $V_{G2}$ of the scanning signal applied to the gate electrode of the second pixel U2 has larger distortions than the waveform $V_{G1}$ of the scanning signal applied to the gate electrode of the first pixel U1.

Further, the potential of the grayscale voltage applied to the drain electrode of the first pixel U1 and the potential of the grayscale voltage applied to the drain electrode of the second pixel U2 change with time respectively as indicated by the waveform $V_{DL1}$ and the waveform $V_{DL2}$. That is, the potential of the drain electrode of the first pixel U1 and the potential of the drain electrode of the second pixel U2 change to a predetermined potential $V_K$ respectively in synchronism with timing at which the potentials of the gate electrodes rise.

Here, the potential of the pixel electrode PX of the first pixel U1 and the potential of the pixel electrode PX of the second pixel U2 change with time as indicated by the waveform $V_{PX1}$ and the waveform $V_{PX2}$. That is, the potential of the pixel electrode PX of the first pixel U1 and the potential of the pixel electrode PX of the second pixel U2 assume the substantially same potential as the potential $V_K$ of the drain electrode (grayscale voltage) respectively at a point of time that the TFT element 10 is switched from an ON state to an OFF state, that is, at a point of time that lowering of the potential of the gate electrodes starts.

Further, in the case where the pixel in the liquid crystal display panel 1 has the constitution shown in FIG. 2 and FIG. 3, when the TFT element 10 is switched from an ON state to an OFF state, for example, the potential of the pixel electrode PX changes by being influenced by a diving voltage via the above-mentioned parasitic capacitance $C_{gs}$. A quantity of change of the potential of the pixel electrode PX which occurs when the TFT element 10 is switched from an ON state to an OFF state is called, in general, a feed-through voltage.

Usually, the remoter the pixel is positioned from the signal input end of the scanning signal line GL, the smaller the magnitude of the feed-through voltage becomes. Accordingly, the feed-through voltage $V_{FT2}$ of the second pixel U2 is smaller than the feed-through voltage $V_{FT1}$ of the first pixel U1.

Accordingly, the potential of the common voltage (optimum common voltages Vcom1, Vcom2) for setting the potential difference between the pixel electrode PX and the common electrode CT to the predetermined value $\Delta V$ differs between the first pixel U1 and the second pixel U2. Further, the TFT elements 10 of a large number of pixels are connected to one scanning signal line GL and the magnitude of the feed-through voltage of each pixel differs depending on the distance from the signal input end of the scanning signal line GL. Accordingly, in writing the grayscale voltage of the potential $V_K$ to the pixel electrodes PX of these pixels, the potential of the optimum common voltage of each pixel differs depending on the distance from the signal input end of the scanning signal line GL.

However, the common voltage Vcom applied to the common electrode CT has the predetermined potential. Accordingly, in writing the grayscale voltage of the potential $V_K$ to a plurality of pixels, the potential difference between the optimum common voltage and the common voltage Vcom applied to the common electrode CT differs among the respective pixels so that the potential difference becomes small in some regions and the potential difference becomes large in other regions. In the conventional liquid crystal display device, a voltage corresponding to the potential difference between the optimum common voltage and the common voltage Vcom applied to the common electrode CT becomes a DC component so that image retention occurs.

As causes of the occurrence of the image retention in the liquid crystal display device, various causes are considered besides the above-mentioned DC component. However, assume that the image retention explained hereinafter is the image retention which occurs due to the above-mentioned DC component.

As a method for reducing such image retention, conventionally, for example, there has been known a method in which a voltage which cancels the above-mentioned DC component (DC offset voltage) is applied to a grayscale voltage or a method in which the magnitude of a parasitic capacitance $C_{gs}$ is adjusted such that the difference in a feed-through voltage among the respective pixels becomes small.

In manufacturing the liquid crystal display panel 1, usually, adopted is a method referred to as multiple-piece simultaneous manufacturing in which a plurality of liquid crystal display panels 1 are collectively manufactured using a pair of mother glasses.

In manufacturing the liquid crystal display panel 1 by multiple-piece simultaneous manufacturing, for example, a circuit (first thin film stacked body) having scanning signal lines GL, video signal lines DL, TFT elements 10 and pixel electrodes PX is formed in a plurality of respective regions set on one of the pair of mother glasses.

Assuming a case where the first thin film stacked body is formed based on one layout data, for example, in the respective regions set on one mother glass 11, it is thought that the plurality of liquid crystal display panels 1 having the TFT substrates 5 cut out from the mother glass 11 exhibit the substantially equal tendency with respect to the image retention which occurs when the liquid crystal display panels 1 are driven under the same condition. However, in the conventional manufacturing method which adopts the multiple-piece simultaneous manufacturing, when the plurality of liquid crystal display panels 1 cut out from one pair of mother glasses are driven under the same condition, the respective liquid crystal display panels 1 exhibit the different image retention tendencies. Here, the image retention tendency implies the relationship between a position of a signal input end of the scanning signal line GL or the video signal line DL and a position where image retention strongly appears or a level (degree of intensity) of image retention.

Accordingly, in suppressing the image retention by applying the DC offset voltage to the grayscale voltage or by adjusting the magnitude of the parasitic capacitance $C_{gs}$ as described above, it is necessary to take the image retention tendency which differs for every liquid crystal display panel 1 into consideration.

In manufacturing the liquid crystal display panel 1 by four-piece simultaneous manufacturing, the image retention tendencies of four liquid crystal display panels 1 obtained from one pair of mother glasses have the following relationship.

FIG. 7 to FIG. 10 are schematic views for explaining tendencies and the level difference in image retentions which occur in the plurality of liquid crystal display panels manufactured by multiple-piece simultaneous manufacturing.

Figure 7:
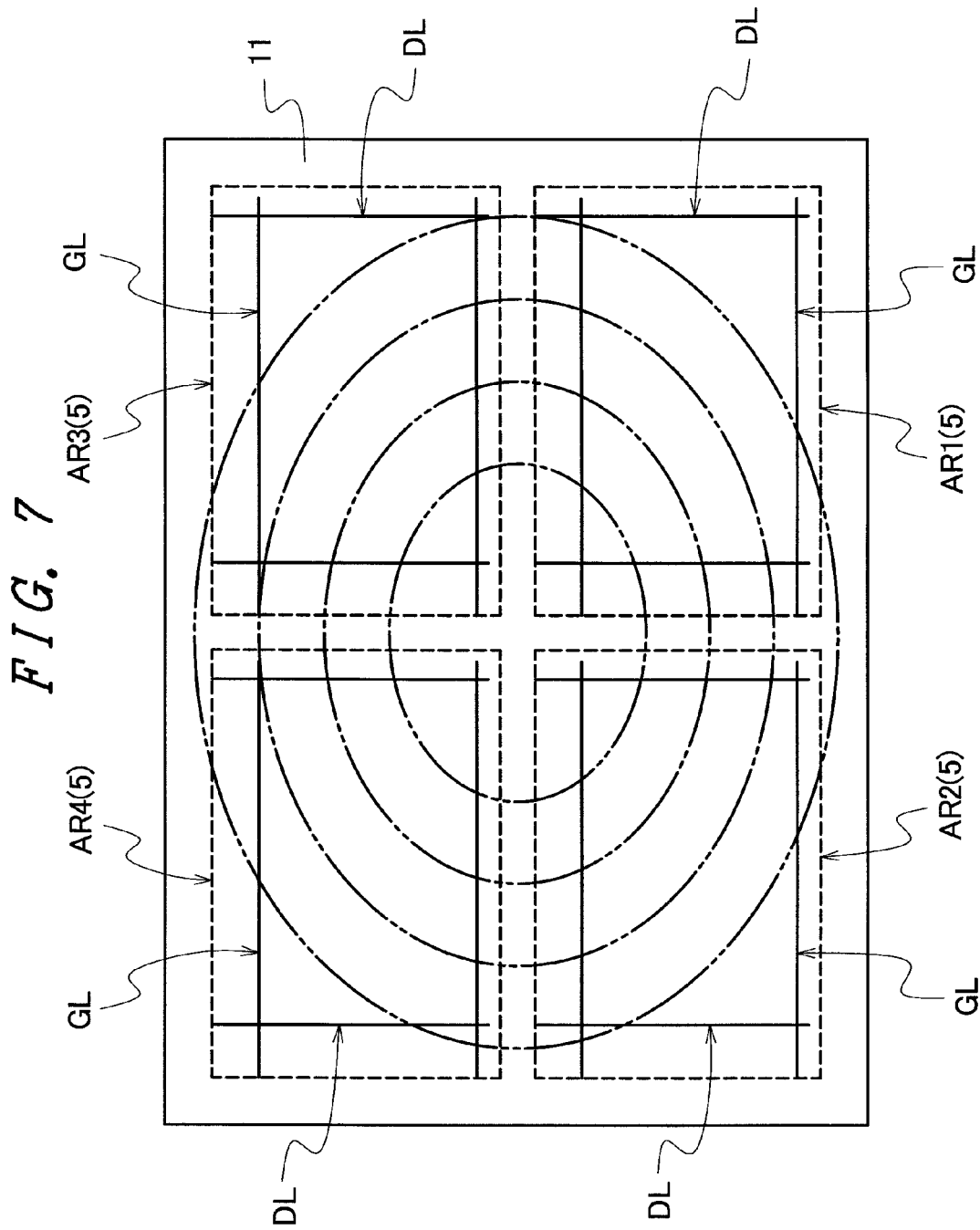
FIG. 7 is a schematic plan view showing one example of the relationship between a region from which TFT substrates are taken out by cutting in four-piece simultaneous manufacturing and the distribution of film thickness of an insulation layer.
Figure 8:
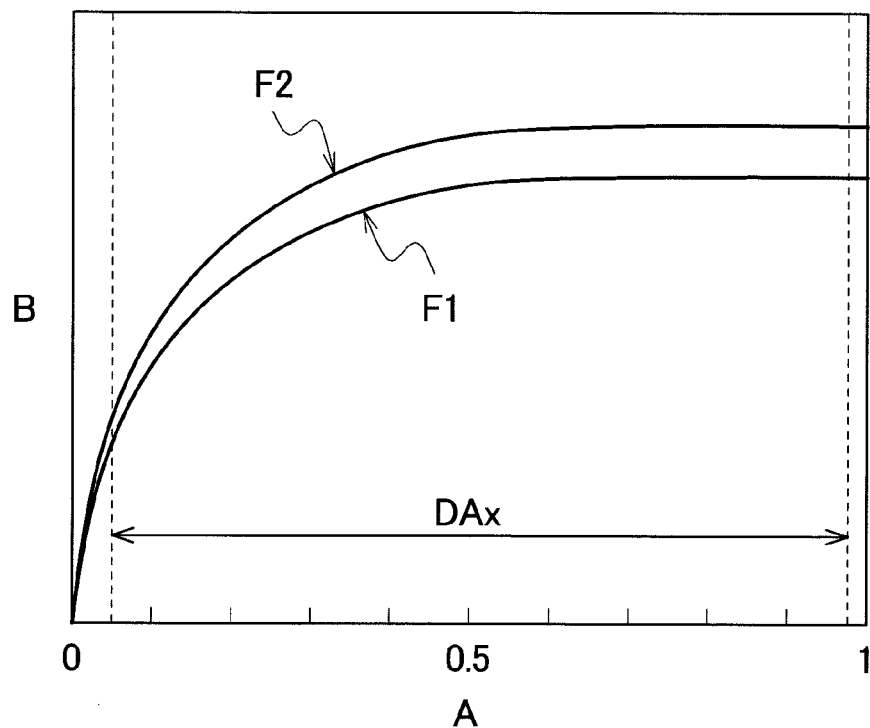
FIG. 8 is a schematic graph showing one example of a delay quantity of a scanning signal on a scanning signal line formed in a region AR1 and a delay quantity of a scanning signal on a scanning signal line formed in a region AR2 in FIG. 7.
Figure 9:
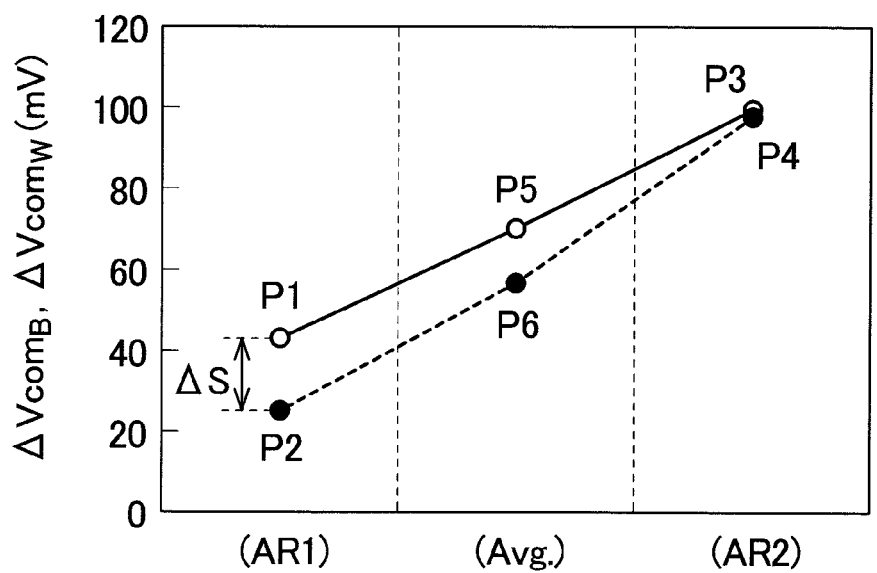
FIG. 9 is a schematic graph showing one example of the distribution of an optimum Vcom value in a liquid crystal display panel having a TFT substrate in the region AR1 in FIG. 7 and the distribution of an optimum Vcom value in a liquid crystal display panel having a TFT substrate in the region AR2 in FIG. 7.
Figure 10:
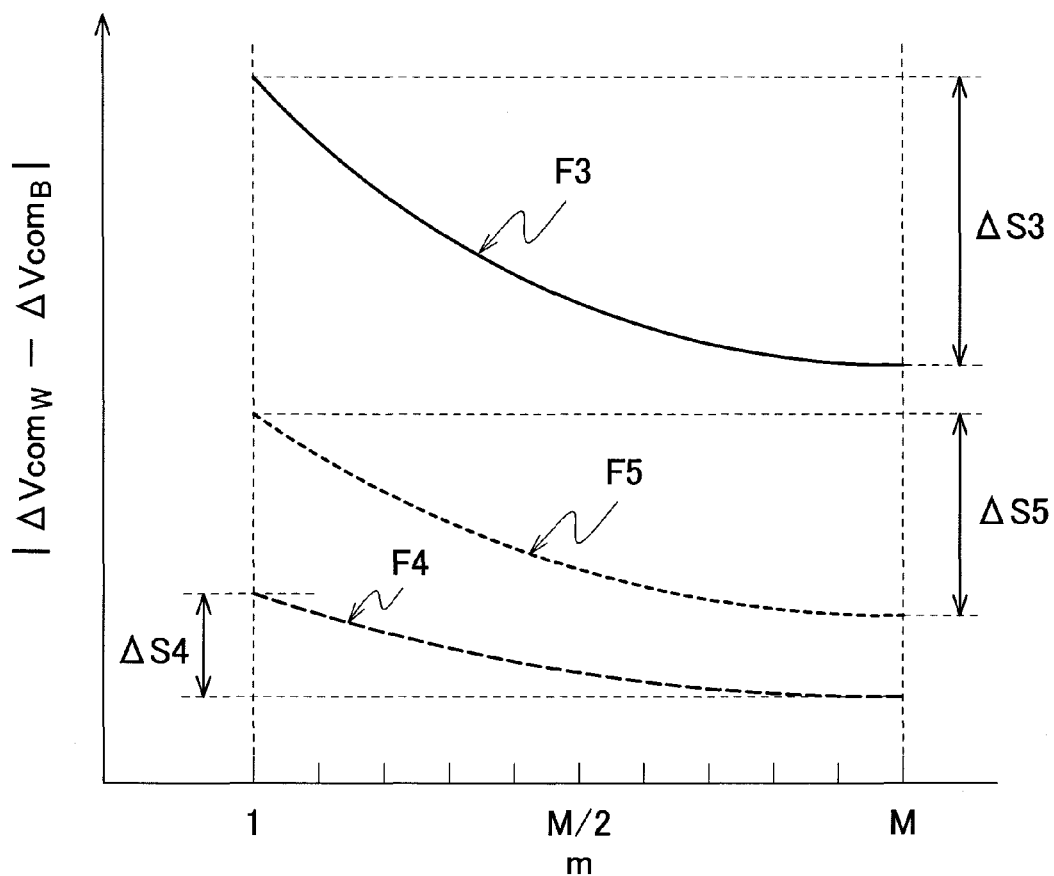
FIG. 10 is a schematic view showing the tendency of image retention in the liquid crystal display panel having the TFT substrate in the region AR1 in FIG. 7 and in the liquid crystal display panel having the TFT substrate in the region AR2 in FIG. 7.

FIG. 7 is a schematic plan view showing one example of the relationship between a region from which TFT substrates are taken out by cutting using four-piece simultaneous manufacturing and the distribution of film thickness of an insulation layer. FIG. 8 is a schematic graph showing one example of a delay quantity of a scanning signal on a scanning signal line formed in a region AR1 and a delay quantity of a scanning signal on a scanning signal line formed in a region AR2 in FIG. 7. FIG. 9 is a schematic graph showing one example of the distribution of an optimum Vcom value in a liquid crystal display panel having a TFT substrate in the region AR1 in FIG. 7 and the distribution of an optimum Vcom value in a liquid crystal display panel having a TFT substrate in the region AR2 in FIG. 7. FIG. 10 is a schematic graph showing the tendency of image retention in the liquid crystal display panel having the TFT substrate in the region AR1 in FIG. 7 and in the liquid crystal display panel having the TFT substrate in the region AR2 in FIG. 7.

In manufacturing the liquid crystal display panel 1 by four-piece simultaneous manufacturing, for example, as shown in FIG. 7, four regions AR1, AR2, AR3, AR4 are set on one mother glass 11 out of the pair of mother glasses, and a circuit (first thin film stacked body) having the scanning signal lines GL, the video signal lines DL, the TFT elements 10, the pixel electrodes PX ad the like, for example, is formed on these four regions AR1, AR2, AR3, AR4 respectively.

Further, when the first thin film stacked body is formed on four regions AR1, AR2, AR3, AR4 respectively based on one layout data, usually, the circuits which are formed on these four regions AR1, AR2, AR3, AR4 have the translational symmetry.

However, in forming an insulation layer such as the first insulation layer 503 in the manufacturing method which adopts multiple-piece simultaneous manufacturing, usually, the insulation layer is formed over the whole surface of the mother glass 11 using a film forming method such as a CVD method. Here, a film thickness of the insulation layer formed on the mother glass 11 (film forming) exhibits the concentric distribution as indicated by a chain double-dashed line in FIG. 7 where the insulation layer has the largest film thickness at the center portion of the mother glass 11, and the film thickness of the insulation layer is gradually and concentrically decreased as the distance from the center is increased. Accordingly, the first thin film stacked bodies which are formed on four regions AR1, AR2, AR3, AR4 respectively exhibit the different relationship between the position of the signal input end of the scanning signal line GL or the signal input end of the video signal line DL and the distribution of the film thickness of the insulation layer.

In the layout data used in the manufacture of the liquid crystal display panel 1, usually, a size of the source electrode 505, an area of an overlapping region between the scanning signal line GL and the source electrode 505 and the like have the same values in respective pixels. Accordingly, when the film thickness of the insulation layer in one sheet of TFT substrate 5 has the two-dimensional distribution, the difference which reflects the distribution of the film thickness of the insulation layer arises among the magnitude of parasitic capacitance $C_{gs}$ of the respective pixels.

Further, the scanning signal line GL formed in the region AR1 and the scanning signal line GL formed in the region AR2 differ from each other with respect to the combination of magnitudes of line capacitances as viewed toward the other end from the signal input end, that is, a time constant. Accordingly, the scanning signal line GL formed in the region AR1 and the scanning signal line GL formed in the region AR2 differ from each other with respect to the relationship between the distance from the signal input end and a delay quantity of a scanning signal as shown in FIG. 8, for example. FIG. 8 is a graph in which a relative value (A) of the distance from the signal input end is taken on an axis of abscissas, and the delay quantity (B) of the scanning signal is taken on an axis of ordinates. Further, on the axis of ordinates of the graph shown in FIG. 8, the delay quantity is increased corresponding to the distance in the upward direction from the origin. Further, a curve F1 and a curve F2 shown in FIG. 8 respectively indicate the delay quantity of the scanning signal on the scanning signal line GL formed in the region AR1 and the delay quantity of the scanning signal on the scanning signal line GL formed in the region AR2. Further, a zone DAx shown in FIG. 8 is a portion of the scanning signal line DL which passes the display region.

Further, when the film thickness of the insulation layer formed on one sheet of the TFT substrate 5 has the two-dimensional distribution, the difference arises also in the relationship between the distance from the signal input end and the delay quantity of the scanning signal with respect to the respective scanning signal lines.

The magnitude of the feed-through voltage which is relevant to the image retention of the liquid crystal display panel 1 is mainly determined based on the magnitude of the parasitic capacitance $C_{gs}$ and the delay quantity of the scanning signal corresponding to the magnitude of the parasitic capacitance $C_{gs}$ (distortions of the waveform of the potential of the gate electrode). Further, the magnitude of the parasitic capacitance $C_{gs}$ changes based on the thickness of the insulation layer.

Accordingly, when four liquid crystal display panels 1 manufactured by four-piece simultaneous manufacturing are driven based on one layout data under the same condition, the difference arises in the image retention tendency among four liquid crystal display panels 1. Here, the tendencies which the image retentions which occur in four liquid crystal display panels 1 are explained later.

The level of the image retention which occurs when the liquid crystal display panel 1 is driven is defined by, for example, the difference between the optimum common voltage $Vcom_B$ when a display is performed with the lowest grayscale (for example, black) and the optimum common voltage $Vcom_W$ when the display is performed with the highest grayscale (for example, white).

In the liquid crystal display panel 1 having the TFT substrate 5 which exhibits the two-dimensional distribution in the film thickness of the insulation layer, the combination of the delay quantity of the scanning signal and the magnitude of the parasitic capacitance $C_{gs}$ differs for every pixel. Accordingly, the optimum common voltages $Vcom_B$, $Vcom_W$ in one sheet of liquid crystal display panel 1 differ for every pixel.

Accordingly, inventors of the present invention have, firstly, investigated the in-plane distribution of the optimum common voltage $Vcom_B$ when the display is performed with the lowest grayscale and the in-plane distribution of the optimum common voltage $Vcom_W$ when the display is performed with the highest grayscale for every liquid crystal display panel 1.

Here, the first liquid crystal display panel 1 having the circuit (TFT substrate 5) formed in the region AR1 and the second liquid crystal display panel 1 having the circuit (TFT substrate 5) formed in the region AR2 differ from each other in the in-plane distribution of the optimum common voltages $Vcom_B$, $Vcom_W$ as shown in FIG. 9, for example.

The difference between a maximum value and a minimum value of the optimum value of the potential of the common electrode PX in one sheet of liquid crystal display panel 1 is taken on an axis of ordinates in FIG. 9. Further, a point P1 and a point P2 in FIG. 9 respectively indicate the difference between a maximum value and a minimum value of the optimum common voltage $Vcom_B$ and the difference between a maximum value and a minimum value of the optimum common voltage $Vcom_W$ in each pixel of the first liquid crystal display panel 1. Further, a point P3 and a point P4 in FIG. 9 respectively indicate the difference between a maximum value and a minimum value of the optimum common voltage $Vcom_B$ and the difference between a maximum value and a minimum value of the optimum common voltage $Vcom_W$ in each pixel of the second liquid crystal display panel 1. Further, a point P5 and a point P6 in FIG. 9 respectively indicate an average value of the differences between maximum values and minimum values of the optimum common voltages $Vcom_B$ and an average value of the differences between maximum values and minimum values of the optimum common voltages $Vcom_W$ with respect to four liquid crystal display panels 1.

The level of image retention which occurs when the liquid crystal display panel 1 is driven corresponds to the difference ΔS between the difference between the maximum value and the minimum value of the optimum common voltage $Vcom_B$ and the difference between the maximum value and the minimum value of the optimum common voltage $Vcom_W$ shown in FIG. 9, for example. Accordingly, to compare the first liquid crystal display panel 1 and the second liquid crystal display panel 1 to each other, the first liquid crystal display panel 1 exhibits the larger level of image retention.

Further, to investigate the relationship between the distance from the signal input end of the scanning signal line GL in the respective pixels arranged in the extending direction of the scanning signal line GL and the difference between the optimum common voltages $Vcom_B$, $Vcom_W$ with respect to the first liquid crystal display panel 1 and the second liquid crystal display panel 1, the relationship shown in FIG. 10 is found, for example.

FIG. 10 is a graph in which an identifier m of the pixel is taken on an axis of abscissas, and the difference between the optimum common voltages $Vcom_B$, $Vcom_W$ is taken on an axis of ordinates. On the axis of ordinates of the graph, the value of the difference between the optimum common voltages $Vcom_B$, $Vcom_W$ is increased corresponding to the distance in the upward direction from the origin. Further, the identifiers m taken on the axis of abscissas in FIG. 10 are integer values for discriminating M pieces of pixels (TFT elements 10) connected to one scanning signal line GL. The integer values are set in order of 1, 2, 3, . . . , M from the pixel closest to the signal input end of the scanning signal line GL.

Further, a curve F3 in FIG. 10 is a distribution curve indicating the relationship between the distance from the signal input end of the scanning signal line DL and the difference between the optimum common voltages $Vcom_B$, $Vcom_W$ in the first liquid crystal display panel 1. A curve F4 in FIG. 10 is a distribution curve indicating the relationship between the distance from the signal input end of the scanning signal line DL and the difference between the optimum common voltages $Vcom_B$, $Vcom_W$ in the second liquid crystal display panel 1. A curve F5 in FIG. 10 is a distribution curve indicating the relationship between the distance from the signal input end of the scanning signal line GL and the difference between the optimum common voltages $Vcom_B$, $Vcom_W$ in a liquid crystal display panel where a film thickness of an insulation layer is uniform in plane (hereinafter referred to as liquid crystal display panel manufactured exactly based on layout data). In FIG. 10, to facilitate the understanding of the relationship among the curve F3, the curve F4 and the curve F5, these curves are shown in a vertically displaced manner.

Further, the curve F3, the curve F4 and the curve F5 shown in FIG. 10 are respectively distribution curves obtained when the first liquid crystal display panel 1, the second liquid crystal display panel 1 and the liquid crystal display panel manufactured exactly based on the layout data are driven under the same condition.

It is understood from FIG. 10 that when the first liquid crystal display panel 1 and the second liquid crystal display panel 1 are driven under the same condition, the remoter the pixel is arranged from the signal input end of the scanning signal line GL, the smaller the difference between the optimum common voltages $Vcom_B$, $Vcom_W$ becomes. Accordingly, in the first liquid crystal display panel 1 and the second liquid crystal display panel 1, the remoter the pixel is arranged from the signal input end of the scanning signal lien GL, the weaker the level of the image retention becomes. Accordingly, the first liquid crystal display panel 1 and the second liquid crystal display panel 1 exhibit the same tendency with respect to the tendency of the image retention as viewed in the extending direction of the scanning signal line GL.

However, in the first liquid crystal display panel 1, the difference ΔS3 between the difference between the optimum common voltages of the pixel at a position closest to the signal input end and the difference between the optimum common voltages of the pixel at a position remotest from the signal input end becomes larger than the difference ΔS5 in the liquid crystal display panel manufactured exactly based on the layout data. That is, in the first liquid crystal display panel 1, the level of image retention as viewed in the extending direction of the scanning signal line GL becomes higher than the level of the corresponding image retention in the liquid crystal display panel manufactured exactly based on the layout data.

To the contrary, in the second liquid crystal display panel 1, the difference ΔS4 between the difference between the optimum common voltages of the pixel at a position closest to the signal input end and the difference between the optimum common voltages of the pixel at a position remotest from the signal input end becomes smaller than the difference ΔS5 in the liquid crystal display panel manufactured exactly based on the layout data. That is, in the second liquid crystal display panel 1, the level of image retention as viewed in the extending direction of the scanning signal line GL becomes lower than the level of the corresponding image retention in the liquid crystal display panel manufactured exactly based on the layout data.

Further, although the detailed explanation using drawings is omitted, the first liquid crystal display panel 1 and the second liquid crystal display panel 1 differ from the liquid crystal display panel manufactured exactly based on the layout data in the level of image retention as viewed in the extending direction of the video signal line DL.

Still further, although the detailed explanation using drawings is omitted, the same goes for the third liquid crystal display panel 1 having the circuit formed in the region AR3 and the fourth liquid crystal display panel 1 having the circuit formed in the region AR4. That is, the third liquid crystal display panel 1 and the fourth liquid crystal display panel 1 differ from the liquid crystal display panel manufactured exactly based on the layout data in the level of image retention as viewed in the extending direction of the scanning signal line GL as well as in the level of image retention as viewed in the extending direction of the video signal line DL.

To conclude the above-mentioned results, the tendencies of the image retention in four liquid crystal display panels 1 manufactured by four-piece simultaneous manufacturing are expressed as shown in Table 1, for example.

TABLE 1

| AREA | AR1 | AR2 | AR3 | AR4 |
|---|---|---|---|---|
| SPECx | bad | favorable | bad | favorable |
| SPECy | bad | bad | favorable | favorable |

In Table 1, SPECx indicates the level of the image retention as viewed in the extending direction of the scanning signal line GL, and SPECy indicates the level of the image retention as viewed in the extending direction of the video signal line DL. Further, in Table 1, "favorable" implies that the level of image retention in the liquid crystal display panel 1 is lower than the level of image retention in the liquid crystal display panel manufactured exactly based on the layout data, and "bad" implies that the level of the image retention in the liquid crystal display panel 1 is higher than the level of the image retention in the liquid crystal display panel manufactured exactly based on the layout data.

In this manner, four liquid crystal display panels 1 manufactured by four-piece simultaneous manufacturing exhibit different tendencies in the image retention which occurs under the same condition.

In suppressing the image retention by applying the DC offset voltage to the grayscale voltage, a grayscale voltage generation circuit of the first drive circuit 2 is adjusted in conformity with the tendency of the image retention which occurs in the liquid crystal display panel 1, for example. Accordingly, to make the tendencies of the image retentions which occur in the liquid crystal display devices having the liquid crystal display panel 1 manufactured by four-piece simultaneous manufacturing uniform, it is necessary to provide four kinds of adjusting methods of the first drive circuit 2.

On the other hand, in suppressing the image retention by adjusting the magnitude of the parasitic capacitance $C_{gs}$, for example, an area of an overlapping region between the scanning signal line GL and the source electrode 505, the in-plane distance between the scanning signal line GL and the pixel electrode PX or the like is corrected in conformity with the tendency of image retention which occurs in the liquid crystal display panel 1. Accordingly, to make the image retentions which occur in the liquid crystal display devices having the liquid crystal display panels 1 manufactured by four-piece simultaneous manufacturing uniform, it is necessary to provide four kinds of corrections with respect to one layout data.

Further, in the conventional manufacturing method of the liquid crystal display panel 1, a conductor pattern for forming the scanning signal lines GL, the source electrode 505, the pixel electrodes PX and the like is usually formed by etching. In forming the conductor pattern by etching, a resist pattern is formed on the conductive film (film forming) formed on the whole surface of the mother glass 11. Here, the resist pattern is formed by photolithography. That is, the resist pattern is formed by exposing and developing a photosensitive material film formed on the conductive film. Here, the exposure of the photosensitive material film is usually performed using an exposure device which has a photo mask. Accordingly, in the conventional manufacturing method of the liquid crystal display panel 1, when the layout data is corrected, it is necessary to prepare a photo mask based on the layout data after the correction. Accordingly, when the exposure is individually made for every region in the manufacturing method by four-piece simultaneous manufacturing, it is necessary to prepare four photo masks which differ in an exposure pattern. Further, when four regions are collectively exposed in the manufacturing method by four-piece simultaneous manufacturing, it is necessary to form different exposure patterns in four regions of one sheet of photo mask.

Further, in forming the insulation layer by a film forming method such as a CVD method, the distribution of a film thickness, that is, the relationship between the distance from the center of the mother glass 11 and a change quantity of the film thickness changes depending on a CVD device or a chamber used in the manufacture of the liquid crystal display panel, for example.

Accordingly, when the conventional image retention suppression method is applied to the conventional manufacturing method of a liquid crystal display panel using multiple-piece simultaneous manufacturing, it is difficult to make tendency of image retention uniform among the liquid crystal display devices having liquid crystal display panels which exhibit the different two-dimensional distribution in film thickness of the insulation layer respectively. In this case, there exists a drawback that manufacturing efficiency of the liquid crystal display device is lowered or a manufacturing cost of the liquid crystal display device is pushed up.

The manufacturing method of a liquid crystal display panel according to the present invention has been made in view of the above-mentioned drawback. According to the manufacturing method of a liquid crystal display panel of the present invention, it is possible to easily make tendency of image retention uniform among the liquid crystal display devices having liquid crystal display panels which exhibit the different two-dimensional distribution in film thickness of the insulation layer respectively. Accordingly, it is possible to suppress the lowering of manufacturing efficiency of the liquid crystal display device or the elevation of a manufacturing cost of the liquid crystal display device.

[Embodiment]

Figure 11:
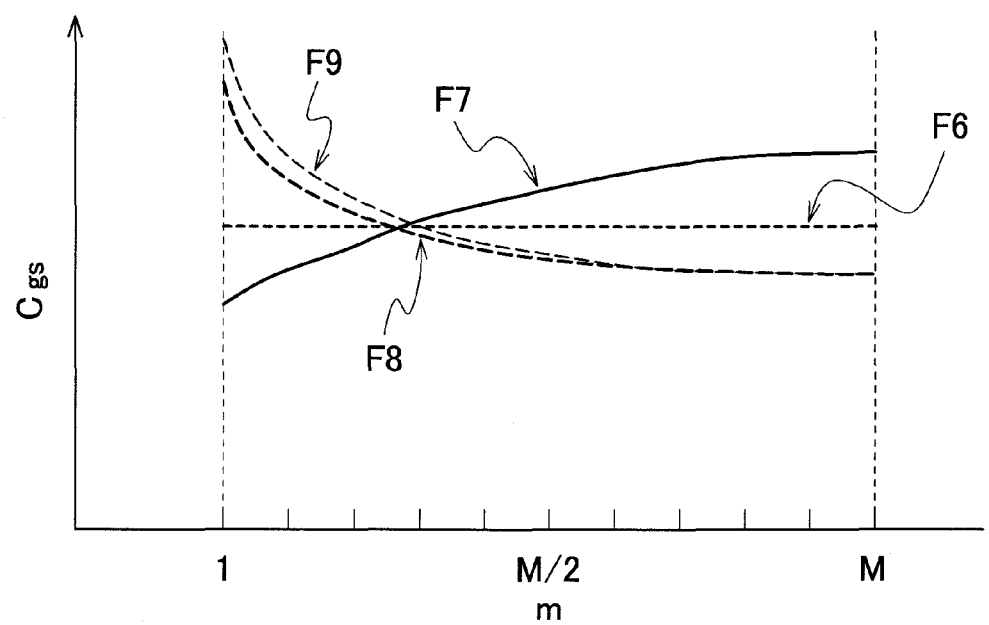
FIG. 11 is a schematic view showing the relationship between the distance from the signal input end and the magnitude of a parasitic capacitance $C_{gs}$.
Figure 12:
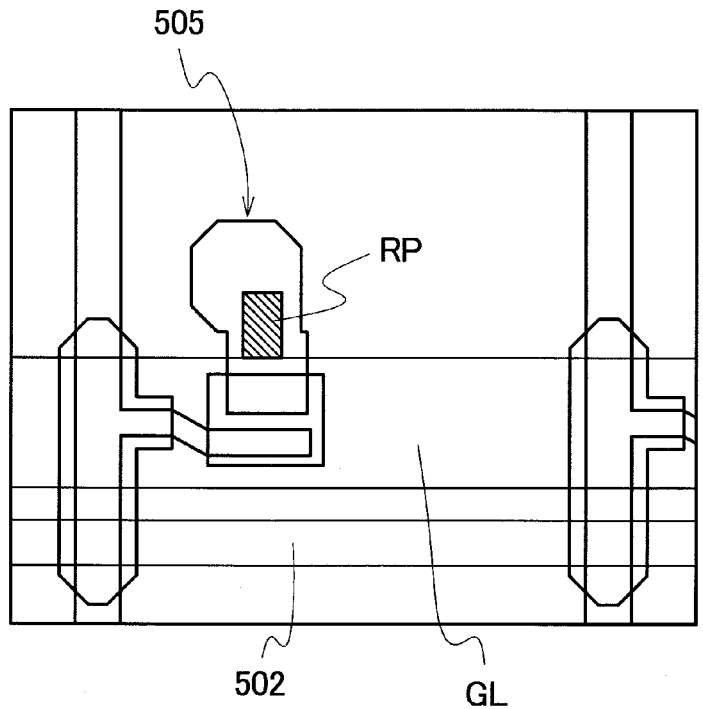
FIG. 12 is a schematic view showing one example of an adjustment method of the parasitic capacitance $C_{gs}$.

FIG. 11 and FIG. 12 are schematic views for explaining the principle of the manufacturing method of a liquid crystal display panel according to one embodiment of the present invention.

FIG. 11 is a schematic view showing the relationship between the distance from the signal input end and the magnitude of a parasitic capacitance $C_{gs}$. FIG. 12 is a schematic view showing one example of an adjustment method of the parasitic capacitance $C_{gs}$.

In this embodiment, the manufacturing method of a liquid crystal display panel by four-piece simultaneous manufacturing shown in FIG. 7 is picked up, and a method for making levels of image retention in four liquid crystal display panels obtained from one pair of mother glasses uniform is explained. Further, in four liquid crystal display panels 1, the pixel having the constitution shown in FIG. 2 and FIG. 3 is formed respectively.

Out of the liquid crystal display panels manufactured by four-piece simultaneous manufacturing, the first liquid crystal display panel 1 having the circuit (TFT substrate 5) formed in the region AR1, and the second liquid crystal display panel 1 having the circuit (TFT substrate 5) formed in the region AR2 respectively exhibit changes shown in FIG. 11, for example, with respect to the magnitude of the parasitic capacitance $C_{gs}$ in each pixel as viewed in the extending direction of the scanning signal line GL.

FIG. 11 is a graph in which an identifier m of the pixel is taken on the axis of abscissas, and the magnitude of the parasitic capacitance $C_{gs}$ is taken on an axis of ordinates. On the axis of ordinates of the graph, the value of the parasitic capacitance $C_{gs}$ is increased corresponding to the distance in the upward direction from the origin. Further, the identifiers m on the axis of abscissas in FIG. 11 are integer values for discriminating M pieces of pixels (TFT elements 10) connected to one scanning signal line GL. The integer values are set in order of 1, 2, 3, . . . , M from the pixel closest to the signal input end of the scanning signal line GL.

Further, a straight line F6 in FIG. 11 is a distribution curve showing the relationship between the distance from the signal input end of the scanning signal line GL and the parasitic capacitance $C_{gs}$ in the liquid crystal display panel where a film thickness of an insulation layer is uniform in plane (liquid crystal display panel manufactured exactly based on the layout data). A curve F7 in FIG. 11 is a distribution curve showing the relationship between the distance from the signal input end of the scanning signal line GL and the parasitic capacitance $C_{gs}$ in the first liquid crystal display panel 1. A curve F8 in FIG. 11 is a distribution curve showing the relationship between the distance from the signal input end of the scanning signal line GL and the parasitic capacitance $C_{gs}$ in the second liquid crystal display panel 1. A curve F9 in FIG. 11 is a distribution curve showing one example of the relationship between the distance from the signal input end of the scanning signal line GL and the parasitic capacitance $C_{gs}$ optimum for suppressing the occurrence of the image retention.

In preparing the layout data, usually assume that the film thickness of the insulation film is uniform in plane. Accordingly, in the liquid crystal display panel 1 manufactured exactly based on the layout data, as viewed in the extending direction of the scanning signal line GL, the relationship between the distance from the signal input end of the scanning signal line GL and the parasitic capacitance $C_{gs}$ assumes the fixed relationship as indicated by the straight line F6 shown in FIG. 11.

To the contrary, in the first liquid crystal display panel 1, the film thickness of the insulation film along the extending direction of the scanning signal line GL is gradually decreased along with the increase of the distance from the signal input end. Accordingly, when the first thin film stacked body is formed based on the above-mentioned layout data, as indicated by the curve F7 shown in FIG. 11, the relationship between the distance from the signal input end of the scanning signal line GL and the parasitic capacitance $C_{gs}$ in the first liquid crystal display panel 1 assumes the relationship where the parasitic capacitance $C_{gs}$ is gradually increased as the distance from the signal input end is increased.

Further, in the second liquid crystal display panel 1, the film thickness of the insulation film along the extending direction of the scanning signal line GL is gradually increased along with the increase of the distance from the signal input end. Accordingly, when the first thin film stacked body is formed based on the above-mentioned layout data, as indicated by the curve F8 shown in FIG. 11, the relationship between the distance from the signal input end of the scanning signal line GL and the parasitic capacitance $C_{gs}$ in the second liquid crystal display panel 1 assumes the relationship where the parasitic capacitance $C_{gs}$ is gradually decreased as the distance from the signal input end is increased.

Further, according to patent document 1 or the like, to reduce the image retention attributed to the delay of the scanning signal, it is desirable that the relationship among the parasitic capacitances $C_{gs}$ of the pixels arranged along the extending direction of the scanning signal line GL assumes the relationship indicated by the curve F9 in FIG. 11, for example.

Accordingly, to reduce the level of the image retention along the extending direction of the scanning line in the first liquid crystal display panel 1 and the second liquid crystal display panel 1, it is sufficient to bring the curve F7 and the curve F8 to the curve F9.

Since the insulation layer such as the first insulation layer 503 is formed by a film forming method such as a CVD method, it is difficult to make the film thickness uniform in plane. Accordingly, in the manufacturing method of a liquid crystal display panel of this embodiment, an electrode area of the parasitic capacitance $C_{gs}$ of each pixel is adjusted by taking the distribution of the film thickness of the insulation layer into consideration thus bringing the relationship between the distance from the signal input end and the magnitude of the parasitic capacitance $C_{gs}$ to the relationship indicated by the curve F9.

Further, in the liquid crystal display panel 1 of this embodiment, for example, as shown in FIG. 12, to adjust the magnitude of the parasitic capacitance $C_{gs}$ of each pixel, a correction pattern RP is applied to a region of the scanning signal line GL which is overlapped to the source electrode 505.

FIG. 13 to FIG. 16 are schematic views showing one example of a correction method of the parasitic capacitance $C_{gs}$ of the pixel formed in the region AR1.

Figure 13:
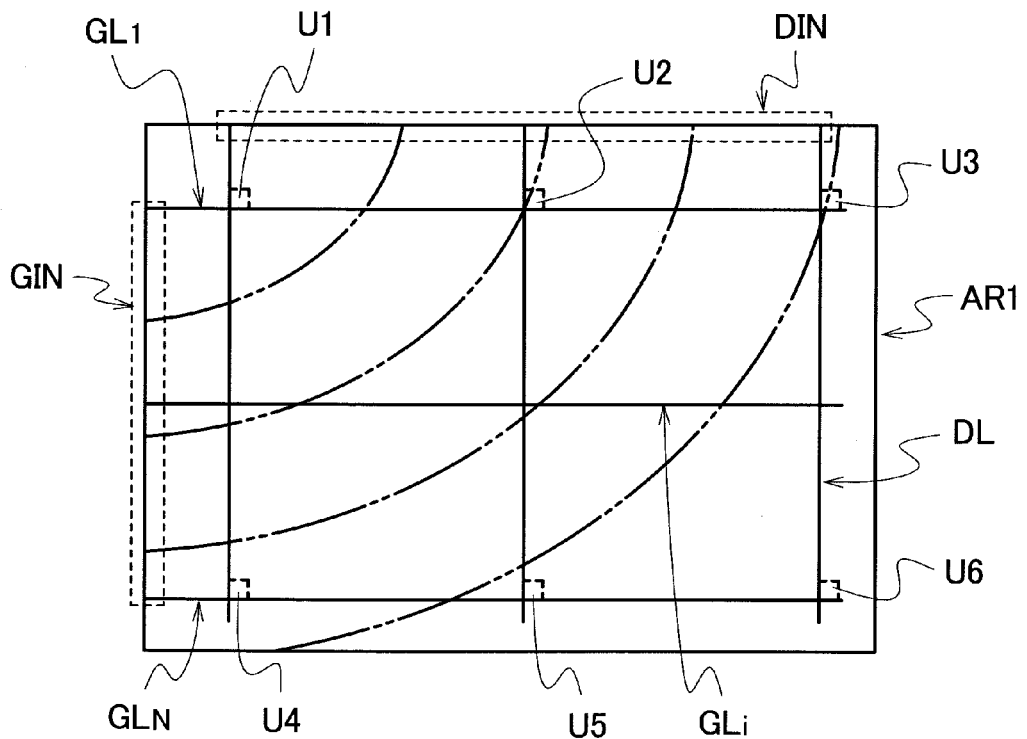
FIG. 13 is a schematic plan view showing the relationship between a position of the signal input end on the TFT substrate formed in the region AR1 and the distribution of film thickness of the insulation layer.
Figure 14:
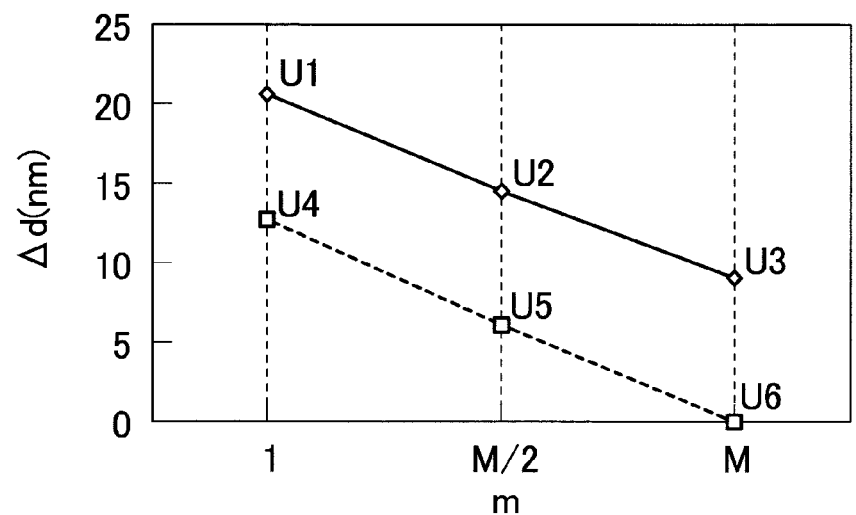
FIG. 14 is a schematic graph showing one example of a change quantity of a film thickness of insulation layer on the TFT substrate formed in the region AR1.
Figure 15:
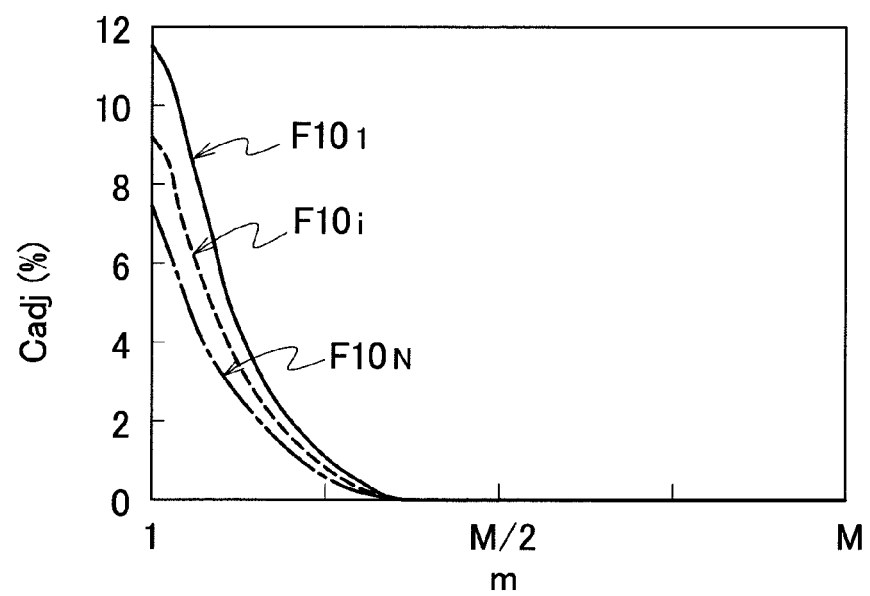
FIG. 15 is a schematic graph showing one example of a correction quantity of the parasitic capacitance $C_{gs}$ of pixels connected to three scanning signal lines shown in FIG. 13.
Figure 16:
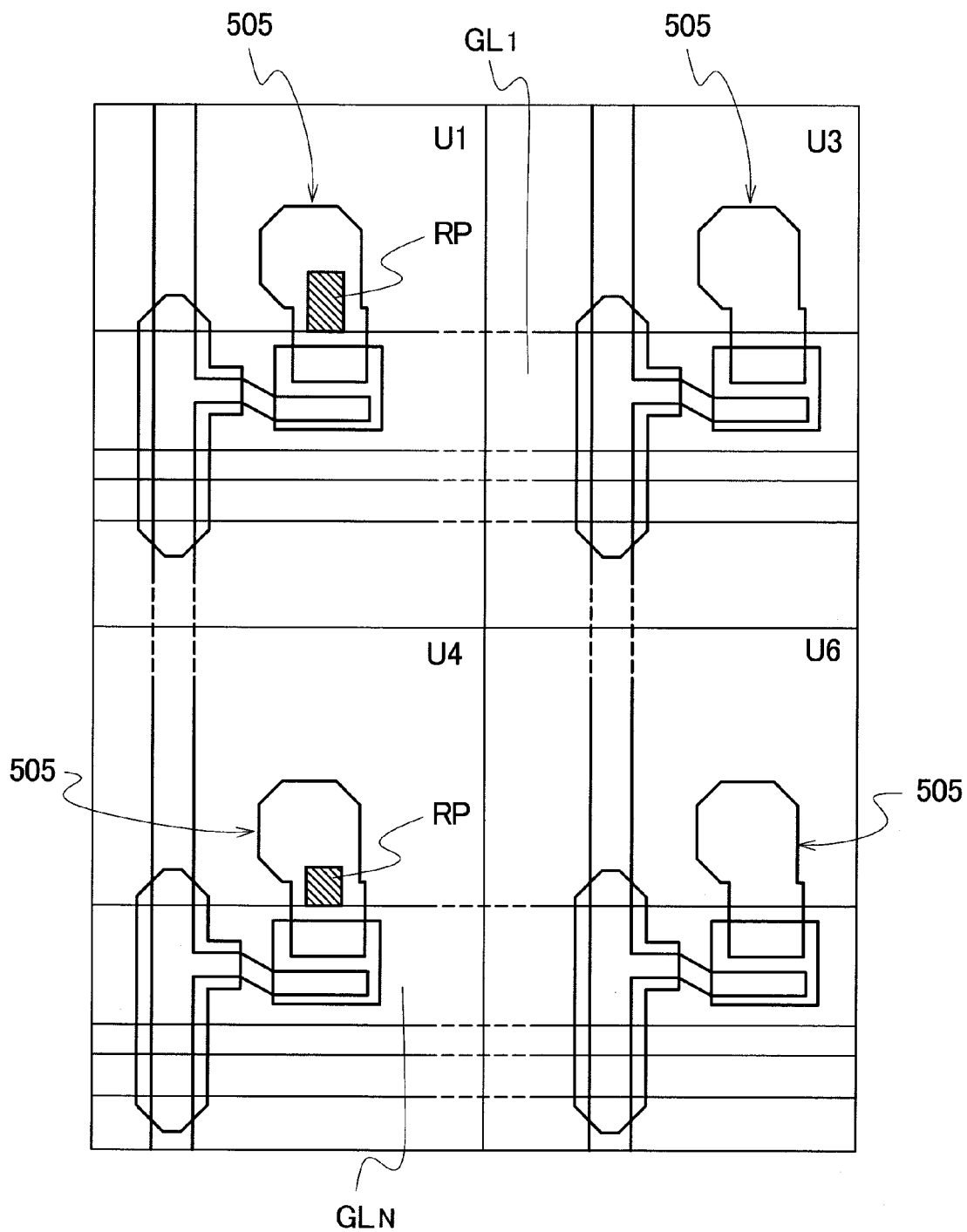
FIG. 16 is a schematic view showing one example of a correction pattern of the pixels at four corners in layout data after correction.

FIG. 13 is a schematic plan view showing the relationship between a position of the signal input end and the distribution of film thickness of the insulation layer on the TFT substrate formed in the region AR1. FIG. 14 is a schematic graph showing one example of a change quantity of a film thickness of insulation layer on the TFT substrate formed in the region AR1. FIG. 15 is a schematic graph showing one example of a correction quantity of the parasitic capacitance $C_{gs}$ of pixels connected to three scanning signal lines shown in FIG. 13. FIG. 16 is a schematic view showing one example of a correction pattern of the pixels at four corners in layout data after correction.

A thickness of the insulation layer formed in the region AR1, for example, as shown in FIG. 13, is gradually decreased along with the increase of the distance from a signal input end GIN of the scanning signal line GL and, at the same time, is gradually decreased along with the increase of the distance from a signal input end DIN of the video signal line DL. Here, the pixel in which the film thickness of the insulation layer becomes smallest is the pixel U6 which is at a position remotest from the signal input end GIN of the scanning signal line GL and remotest from the signal input end DIN of the video signal line DL. That is, when the respective pixels have the same overlapping area between the scanning signal line GL and the source electrode 505, the pixel which has the largest parasitic capacitance $C_{gs}$ is the pixel U6.

Accordingly, in adjusting the parasitic capacitances $C_{gs}$ of the respective pixels by applying the correction pattern shown in FIG. 12, the adjustment is performed using the magnitude of the parasitic capacitance $C_{gs}$ in the pixel U6 as the reference.

In the region AR1, when the thickness of the insulation layer in the pixel U6 is used as the reference film thickness, the relationship of difference between the reference film thickness and the thickness of the insulation layer in the respective pixels U1, U2, U3, U4, U5, U6 within the display region assumes the relationship shown in FIG. 14, for example. The difference in thickness of the insulation film is taken on an axis of ordinates in FIG. 14.

Here, to bring the distribution of the parasitic capacitance $C_{gs}$ of the pixel connected to the scanning signal line $GL_N$ at a position remotest from the signal input end DIN of the video signal line DL to the curve F9 shown in FIG. 11, for example, the parasitic capacitances $C_{gs}$ of the respective pixels connected to the scanning signal line $GL_N$ are determined using the parasitic capacitance $C_{gs}$ in the pixel U6 as the reference, for example. The film thickness of the insulation layer on the scanning signal line $GL_N$ changes as indicated by a dotted line in FIG. 14. Accordingly, in the region AR1, the distribution of the parasitic capacitance $C_{gs}$ of the pixel connected to the scanning signal line $GL_N$ at the position remotest from the signal input end DIN of the video signal line DL is set to the distribution indicated by a curve $F10_N$ shown in FIG. 15, for example.

Further, to bring the distribution of the parasitic capacitance $C_{gs}$ of the pixel connected to the scanning signal line $GL_1$ at a position closest to the signal input end DIN of the video signal line DL to the curve F9 shown in FIG. 11, for example, the parasitic capacitances $C_{gs}$ of the respective pixels connected to the scanning signal line $GL_1$ are determined using the parasitic capacitance $C_{gs}$ in the pixel U3 as the reference. The film thickness of the insulation layer on the scanning signal line $GL_1$ changes as indicated by a solid line in FIG. 14, wherein the film thickness of the insulation layer in the pixel U3 at a position remotest from the signal input end GIN of the scanning signal line $GL_1$ is set larger than the film thickness of the insulation layer in the pixel U6. Accordingly, in the region AR1, the distribution of the parasitic capacitance $C_{gs}$ of the pixel connected to the scanning signal line $GL_1$ at the position closest to the signal input end DIN of the video signal line DL is set to the distribution indicated by a curve $F10_1$ shown in FIG. 15, for example.

Further, the distribution of the parasitic capacitance $C_{gs}$ of the pixel connected to another scanning signal line $GL_i$ can be determined in the same manner. Here, in the region AR1, the distribution of the parasitic capacitance $C_{gs}$ of the pixel connected to the scanning signal line $GL_i$ assumes the distribution indicated by the curve $F10_i$ shown in FIG. 15, for example.

Here, when the circuit (first thin film stacked body) is formed in the region AR1 by correcting the layout data such that the size of the correction pattern in each pixel conforms to the above-mentioned distribution, the relationship of overlapping region between the scanning signal line GL and the source electrode 505 in four pixels U1, U3, U4, U6 positioned at four corners of the display region assumes the relationship shown in FIG. 16, for example.

By adopting such overlapping region relationship, the combination of (time constant) of the line capacitance and the region becomes substantially equal among the respective scanning signal lines $GL_n$ so that the relationship between the distance from the signal input end and the delay quantity becomes substantially equal among the respective scanning signal lines $GL_n$. Further, the relationship between the distance from the signal input end and the change quantity of the magnitude of the parasitic capacitance $C_{gs}$ becomes substantially equal among the respective scanning signal lines $GL_n$. Accordingly, the liquid crystal display panel 1 having the circuit formed in the region AR1 can suppress the image retention even when a DC offset voltage is sufficiently small, for example.

Figure 17:
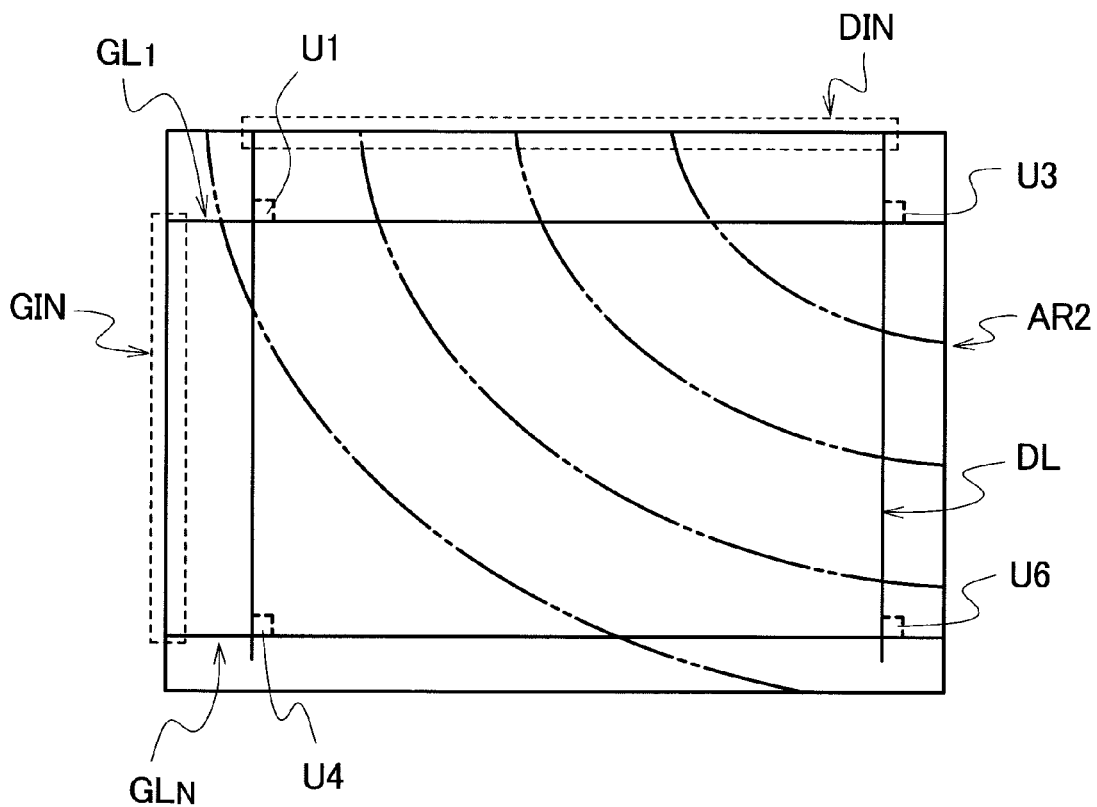
FIG. 17 is a schematic plan view showing the relationship between a position of the signal input end on the TFT substrate formed in the region AR2 and the distribution of film thickness of the insulation layer.
Figure 18:
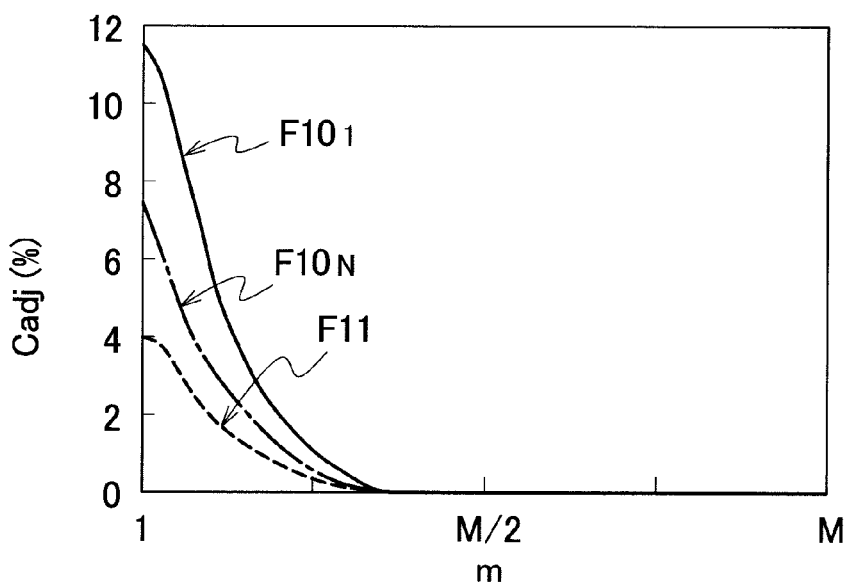
FIG. 18 is a schematic graph showing one example of a correction quantity of the parasitic capacitance $C_{gs}$ of pixels connected to video signal lines shown in FIG. 17.
Figure 19:
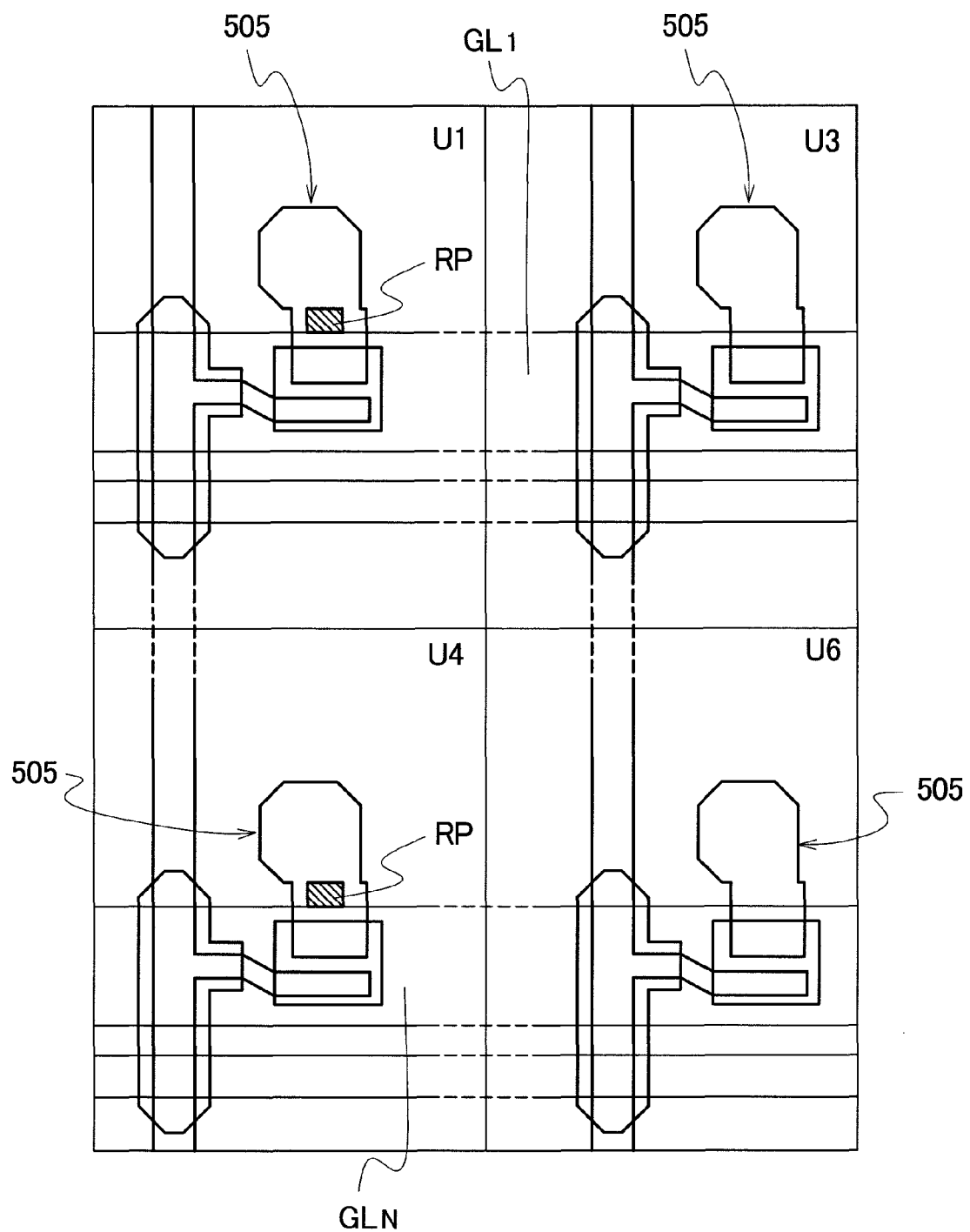
FIG. 19 is a schematic view showing one example of a correction pattern of the pixels at four corners in layout data after correction.

FIG. 17 to FIG. 19 are schematic views showing one example of the correction method of the parasitic capacitance $C_{gs}$ of the pixel formed in the region AR2.

FIG. 17 is a schematic plan view showing the relationship between a position of the signal input end and the distribution of film thickness of the insulation layer on the TFT substrate formed in the region AR2. FIG. 18 is a schematic graph showing one example of a correction quantity of the parasitic capacitance $C_{gs}$ of pixels connected to the video signal lines shown in FIG. 17. FIG. 19 is a schematic view showing one example of a correction pattern of the pixels at four corners in layout data after correction.

A thickness of the insulation layer formed in the region AR2, for example, as shown in FIG. 17, is gradually increased along with the increase of the distance from the signal input end GIN of the scanning signal line GL and, at the same time, is gradually decreased along with the increase of the distance from the signal input end DIN of the video signal line DL.

In the region AR2, for example, as shown in FIG. 10, even when the inputted DC offset voltage is set smaller than the inputted DC offset voltage applied to the liquid crystal display panel 1 formed in the region AR1, the level of image retention as viewed in the extending direction of the scanning signal line GL becomes smaller compared to the level of image retention in the liquid crystal display panel manufactured exactly based on the layout data. However, the level of image retention in the region AR2 is larger than the level of image retention in the region AR1 after correction. Accordingly, even in the circuit formed in the region AR2, the parasitic capacitance $C_{gs}$ of the pixel formed in the region AR2 is corrected in the same manner as the parasitic capacitance $C_{gs}$ of the pixel in the region AR1 so that the distribution of the parasitic capacitance $C_{gs}$ of the pixel connected to one scanning signal line assumes a curve F11 shown in FIG. 18, for example.

Here, when the layout data is corrected such that a size of a correction pattern in each pixel follows the above-mentioned distribution and the circuit (first thin film stacked body) is formed in the region AR2, the relationship of an overlapping region between the scanning signal line GL and the source electrode 505 among four pixels U1, U3, U4, U6 positioned at four corners of a display region assumes the relationship shown in FIG. 19, for example.

By setting the relationship of the overlapping region in this manner, the combination of line capacitance (time constant) and the region becomes substantially equal among the respective scanning signal lines $GL_n$ and hence, the relationship between the distance from the signal input end and the delay quantity becomes substantially equal. Further, the relationship between the distance from the signal input end and a change quantity of magnitude of the parasitic capacitance $C_{gs}$ becomes substantially equal among the respective scanning signal lines. Accordingly, it is possible to suppress the image retention in the liquid crystal display panel 1 having the circuit formed in the region AR2.

Figure 20:
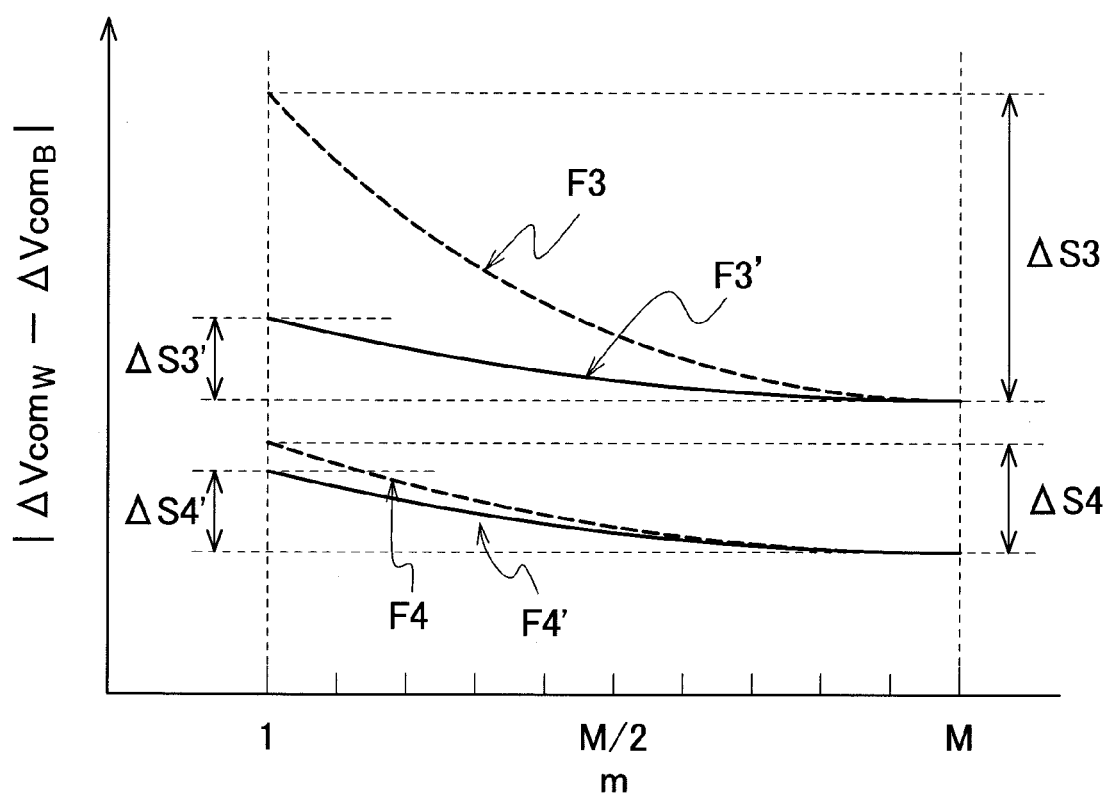
FIG. 20 is a schematic view showing one example of the manner of operation and advantageous effects of the manufacturing method of the embodiment.

FIG. 20 is a schematic view showing one example of the manner of operation and advantageous effects of the manufacturing method of this embodiment.

In the manufacturing method of a liquid crystal display panel according to this embodiment, as described above, to compare the first liquid crystal display panel 1 and the second liquid crystal display panel 1 manufactured by four-piece simultaneous manufacturing, the first liquid crystal display panel 1 and the second liquid crystal display panel 1 differ from each other in the relationship of the area of the overlapping region between the scanning signal line GL and the source electrode 505 in each pixel.

However, in the first liquid crystal display panel 1 and the second liquid crystal display panel 1, the magnitude of the parasitic capacitance $C_{gs}$ in each pixel is adjusted based on the distribution of the film thickness of the first insulation layer 503 respectively. Accordingly, when the first liquid crystal display panel 1 and the second liquid crystal display panel 2 are driven under the same condition, for example, as shown in FIG. 20, levels ΔS3', ΔS4' of the image retentions as viewed in the extending direction of the scanning signal line in the respective liquid crystal display panels 1 become smaller than and, thereafter, become substantially equal to levels ΔS3, ΔS4 of the image retentions of the liquid crystal display panels 1 before the correction.

Further, although the detailed explanation is omitted, also with respect to the circuits (first thin film stacked bodies) formed in the region AR3 and the region AR4, by determining the magnitude of the parasitic capacitance $C_{gs}$ in each pixel based on the same idea as that of parasitic capacitance $C_{gs}$ applied to the region AR1 and the region AR2, it is possible to make the level of image retention as viewed in the extending direction of the scanning signal line GL small also with respect to the third liquid crystal display panel 1 having the circuit formed in the region AR3 and the fourth liquid crystal display panel 1 having the circuit formed in the region AR4.

Accordingly, in the manufacturing method of a liquid crystal display panel according to this embodiment, even when the DC offset voltage is not changed for every liquid crystal display panel when four liquid crystal display panels obtained from one pair of mother glasses are driven, it is possible to suppress the image retention in the respective liquid crystal display panels 1, and the tendency of image retention among four liquid crystal display panels 1 can be made uniform.

When the area of the overlapping region between the scanning signal line GL and the source electrode 505 is changed corresponding to the distribution of the film thickness of the insulation layer in this manner, in the conventional manufacturing method of the liquid crystal display panel 1, for example, it is necessary to correct the layout data relating to the scanning signal line GL in four ways, and to prepare four kinds of photo masks used in a step of forming the scanning signal lines GL.

Further, the distribution of the film thickness of the insulation layer may differ depending on a CVD device or a chamber to be used. Accordingly, the correction of layout data and the separate preparation of the photo masks corresponding to the distribution of the film thickness of the insulation layer are inefficient.

Accordingly, in the manufacturing method of the liquid crystal display panel according to this embodiment, the exposure of a photosensitive material film executed in a step of forming the scanning signal lines GL is performed using an exposure device which is referred to as a direct-drawing exposure system or a direct exposure system.

The exposure device of the direct-drawing exposure system uses a spatial optical modulation element which generates an exposure pattern by a numerical control in place of a photo mask. Here, the spatial optical modulation element performs a control based on drawing data (numerical value data) obtained by converting layout data under predetermined conditions. Accordingly, when the photosensitive material film is exposed using the exposure device of direct-drawing exposure system, it is possible to change an exposure pattern by merely changing numerical values of the layout data.

Figure 21:
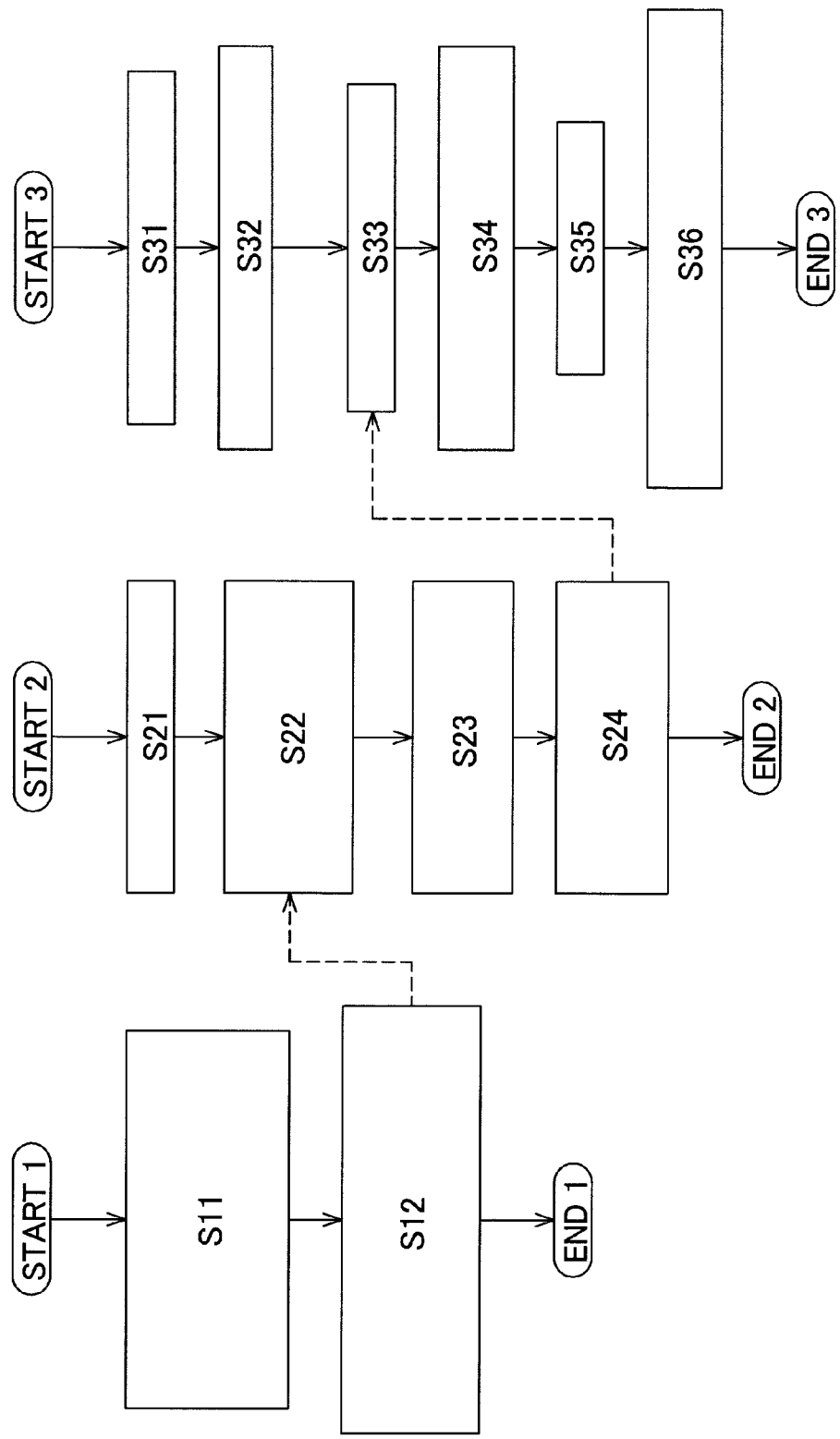
FIG. 21 is a schematic flowchart for explaining main steps of the manufacturing method of a liquid crystal display panel according to the embodiment.

FIG. 21 is a schematic flowchart for explaining main steps of the manufacturing method of a liquid crystal display panel according to the embodiment.

The manufacturing method of the liquid crystal display panel of the embodiment 1 includes, for example, three steps consisting of a step of registering the relationship between the CVD device and the correction quantity of the parasitic capacitance $C_{gs}$, a step of converting the layout data into the drawing data, and a step of manufacturing the liquid crystal display panel 1.

In the step of registering the relationship between the CVD device and the correction quantity of the parasitic capacitance $C_{gs}$, processing ranging from START1 to END1 shown in FIG. 21 is performed, for example. Firstly, the relationship between the CVD device and the chamber number used in the manufacture of the liquid crystal display panel, and the distribution of the film thickness of the insulation layer is registered in a film thickness distribution data base of a predetermined data server, for example (step S11).

Here, the relationship between the CVD device and the distribution of the film thickness of the insulation layer is measured for every machine number of the CVD device or every chamber, for example. Then, in the film thickness distribution database, for example, data in which the machine number of the CVD device, the chamber number, the surface-mounting position (region) on the mother glass, and the tendency of the distribution of the film thickness of the insulation film are correlated with each other is registered.

Next, in the data server, for example, the correction quantity of the parasitic capacitance $C_{gs}$ shown in FIG. 15 is calculated for every above-mentioned correlation registered in the film thickness distribution data base, and is registered in the correction data base in correlation with the CVD device and the chamber number (step S12).

Here, in the correction database, for example, data in which the machine number of the CVD device, the chamber number, the surface-mounting position (region) on the mother glass and tendency of the distribution of the film thickness of the insulation film are correlated with the correction quantity of the parasitic capacitance $C_{gs}$ is registered.

In the step of registering the relationship between the CVD device and the parasitic capacitance $C_{gs}$, the processing in step S11 and step S12 is performed periodically, for example.

Further, in the step of converting the layout data into the drawing data, the processing ranging from START2 to END2 shown in FIG. 21 is performed, for example. Firstly, the layout data formed by CAD or the like is registered in the data server (step S21).

Here, in the data server, based on the registered layout data and the correction quantity of the parasitic capacitance $C_{gs}$ registered in the database, the correction quantity of an area of an overlapping region between the scanning signal line and the source electrode is determined (step S22), and the layout data is corrected based on the determined correction quantity (S23).

Next, in the data server, the drawing data is formed based on the corrected layout data and the drawing data is registered in a drawing database (step S24).

Here, in the drawing database, the machine number of the CVD device, the chamber number, the surface-mounting position (region) on the mother glass and the drawing data are registered in a correlated manner.

When the relationship between the CVD device and the correction quantity of the parasitic capacitance $C_{gs}$ is changed, the drawing data is also changed.

Further, steps of the manufacturing method of the liquid crystal display panel 1 are substantially equal to the conventional steps. That is, the manufacturing method of the liquid crystal display panel 1 includes a step of forming the TFT substrate 5, a step of forming a counter substrate 6, and a step of adhering the TFT substrate 5 and the counter substrate 6 to each other and sealing a liquid crystal material (liquid crystal layer 7) in a space defined between the TFT substrate 5 and the counter substrate 6. Here, in the step of forming the TFT substrate 5, for example, processing ranging from START3 to END3 shown in FIG. 21 is performed. Firstly, a conductive film for forming scanning signal lines GL is formed on the mother glass (film forming), and a photosensitive material film is formed on the conductive film (film forming) (step S31).

The exposure of the photosensitive material film formed on the conductive film is performed by the exposure device of the direct-drawing exposure system described above. In exposing the photosensitive material film using the direct-drawing exposure device, firstly, for example, the machine number and the chamber number of the CVD device used in forming the first insulation layer 503 are set in the exposure device (step S32) so that the exposure device obtains drawing data registered in a drawing data base (step S33).

Here, for example, based on the machine number and the chamber number of the CVD device, four kinds of drawing data which respectively correspond to surface-mounting positions (four regions set on the mother glass) are registered in the exposure device.

Upon obtaining four kinds of drawing data, the exposure device performs the exposure of four regions set on the mother glass using the drawing data (step S34).

Next, by developing the photosensitive material film and by etching the conductive film, the scanning signal lines GL having a planar shape which reflect the obtained drawing data are formed in four regions of the mother glass (step S35).

Thereafter, the first insulation layer 503 is formed by the CVD device which is designated at the time of exposing the photosensitive material film. Subsequently, the formation of the semiconductor layers 504 of the TFT elements 10, and the formation of the video signal lines DL and the source electrodes 505 and the like are performed thus forming a predetermined circuit (first thin film stacked body) in each region (step S36).

Further, although not shown in the drawing, along with the above-mentioned processing, the counter substrates 6 are formed on the other mother glass, these two mother glasses are adhered to each other, and the liquid crystal material (liquid crystal layer 7) is sealed between these two mother glasses. Then, by cutting the mother glasses in accordance with respective regions, four liquid crystal display panels 1 can be obtained.

When these four liquid crystal display panels 1 obtained in this manner are driven under the same condition as described above, the image retention in each liquid crystal display panel 1 is suppressed, and the level of the image retention among four liquid crystal display panels 1 become substantially equal.

In the manufacture of the liquid crystal display panels 1 in accordance with the above-mentioned steps, even when the CVD device or the chamber used in forming the first insulation layer 503 differs among liquid crystal display panels 1, it is possible to set the level of image retention among the liquid crystal display panels 1.

In the manufacturing method of this embodiment, even when the distribution of the film thickness in the CVD device changes half way, for example, the magnitude of the parasitic capacitance $C_{gs}$ can be changed easily.

As has been explained heretofore, according to the manufacturing method of a liquid crystal display device of this embodiment, the image retention in each liquid crystal display panel can be suppressed easily and, at the same time, the level of the image retention can be made uniform easily among the plurality of liquid crystal display panels.

Although the present invention has been specifically explained in conjunction with the embodiments heretofore, it is needless to say that the present invention is not limited by the embodiments, and various modifications can be made without departing from the gist of the present invention.

For example, in the above-mentioned embodiments, the case where the liquid crystal display panels are manufactured by four-piece simultaneous manufacturing is exemplified. However, it is needless to say that the manufacturing method of the present invention is not limited to four-piece simultaneous manufacturing and the manufacturing method of the present invention is applicable to a manufacturing method of a liquid crystal display panel by n-piece simultaneous manufacturing which can collectively manufacture arbitrary n pieces of liquid crystal display panels using a pair of mother glasses.

Further, in the above-mentioned embodiment, the case in which the liquid crystal display panel having pixels each of which has the constitution shown in FIG. 2 and FIG. 3, for example, is manufactured is exemplified. However, the manufacturing method of the present invention is not limited to such a case. That is, provided that the liquid crystal display panel has the structure where the source electrode of the TFT element of each pixel has the portion which is overlapped to the gate electrode (scanning signal line) and a portion which is not overlapped to the gate electrode (scanning signal line) and the image retention occurs when the liquid crystal display panel is manufactured exactly based on the layout data, the present invention is applicable to any liquid crystal display panel. That is, the manufacturing method of the present invention is applicable to the manufacturing method of a liquid crystal display panel in which common electrodes are formed on a TFT substrate side as in the case of an IPS-type liquid crystal display panel or the like, for example.

Further, when the liquid crystal display panel manufactured by the manufacturing method of the embodiment is driven, for example, as shown in FIG. 20, there may be a case where although the level of image retention is reduced, the level cannot be completely set to zero. In such a case, to drive the liquid crystal display panel manufactured by the manufacturing method of the embodiment, for example, the liquid crystal display panel may be driven by applying a DC offset voltage to a grayscale voltage. By applying the DC offset voltage may be applied to the grayscale voltage, the level of image retention can be further reduced. Here, among a plurality of liquid crystal display panels obtained from a pair of mother glasses, the level of image retention is substantially equal irrespective of the distribution of the film thickness of the insulation layer. Accordingly, in driving the plurality of liquid crystal display panels by applying the DC offset voltage to the grayscale voltage, the first drive circuit can be adjusted easily.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A liquid crystal display device comprising a liquid crystal display panel in which a liquid crystal material is sealed between a TFT substrate and a counter substrate, the liquid crystal display panel being configured such that
    the TFT substrate includes a plurality of scanning signal lines, a plurality of video signal lines, a plurality of TFT elements and a plurality of pixel electrodes,
    the plurality of TFT elements respectively have a gate electrode thereof connected to one scanning signal line out of the plurality of scanning signal lines, and have a drain electrode thereof connected to one video signal line out of the plurality of video signal lines, and
    the combination of the scanning signal line to which the gate electrode is connected and the video signal line to which the drain electrode is connected differs for every TFT element, wherein
    a source electrode of the TFT element includes a portion which is overlapped to the scanning signal line and a portion which is not overlapped to the scanning signal line,
    the plurality of TFT elements which are connected to said one scanning signal line set the relationship between a distance from a signal input end of the scanning signal line and an area of an overlapping region between the source electrode and the scanning signal line to the monotonous decrease relationship.

2. A liquid crystal display device according to claim 1, wherein the plurality of TFT elements which are connected to one video signal line set the relationship between the distance from a signal input end of the video signal line and the area of the overlapping region between the source electrode and the scanning signal line to the monotonous decrease relationship.

3. A manufacturing method of a liquid crystal display device comprising the steps of:
    forming a TFT substrate in which a plurality of scanning signal lines, a plurality of video signal lines, a plurality of TFT elements and a plurality of pixel electrodes are formed based on preset layout data;
    forming a counter substrate;
    adhering the TFT substrate and the counter substrate to each other; and
    filling a liquid crystal material in a space defined between the TFT substrate and the counter substrate, wherein
    a source electrode of each one of the plurality of TFT elements is connected to the pixel electrode, and includes a portion which is overlapped to the scanning signal line and a portion which is not overlapped to the scanning signal line,
    the step of forming the TFT substrate comprises:
    a first step in which the plurality of scanning signal lines are formed;
    a second step in which a first insulation layer is formed after the first step; and
    a third step in which semiconductor layers of the TFT elements, the plurality of video signal lines and the source electrodes of the TFT elements are formed on the first insulation layer,
    the first step comprises the steps of:
    forming a conductive film;
    forming a photosensitive material film on the conductive film;
    exposing and developing the photosensitive material film; and
    removing undesired portions of the conductive film using the developed photosensitive material film as a mask,
    the exposure of the photosensitive material film is performed using an exposure device having a spatial light modulating element which generates an exposure pattern by a numerical control based on drawing data prepared based on the layout data, and
    the drawing data is prepared by correction such that a shape of a portion of the scanning signal line in the layout data which is overlapped to the source electrode has an area corresponding to the distribution of a film thickness of the first insulation layer formed in the second step.

4. The manufacturing method of a liquid crystal display device according to claim 3, wherein a plurality of TFT substrates are collectively formed using one mother substrate in the step of forming the TFT substrate, and
    the exposure of the photosensitive material film performed in the first step is performed using the drawing data which differs for every position of the TFT substrate on the mother substrate.

* * * * *